United States Patent
Far

(10) Patent No.: US 10,594,334 B1
(45) Date of Patent: Mar. 17, 2020

(54) MIXED-MODE MULTIPLIERS FOR ARTIFICIAL INTELLIGENCE

(71) Applicant: Ali Tasdighi Far, San Jose, CA (US)

(72) Inventor: Ali Tasdighi Far, San Jose, CA (US)

( * ) Notice: Subject to any disclaimer, the term of this patent is extended or adjusted under 35 U.S.C. 154(b) by 0 days.

(21) Appl. No.: 16/381,245

(22) Filed: Apr. 11, 2019

Related U.S. Application Data

(60) Provisional application No. 62/658,678, filed on Apr. 17, 2018.

(51) Int. Cl.
| | |
|---|---|
| H03M 1/10 | (2006.01) |
| H03M 1/46 | (2006.01) |
| G06F 17/16 | (2006.01) |
| H03M 1/12 | (2006.01) |
| H03M 1/14 | (2006.01) |

(52) U.S. Cl.
CPC ............ *H03M 1/466* (2013.01); *G06F 17/16* (2013.01); *H03M 1/125* (2013.01); *H03M 1/14* (2013.01)

(58) Field of Classification Search
CPC ......... H03M 1/466; H03M 1/125; H03M 1/14
USPC .................. 341/155, 144, 150, 172
See application file for complete search history.

(56) References Cited

U.S. PATENT DOCUMENTS

| | | | |
|---|---|---|---|
| 3,013,724 A | 12/1961 | Thompson et al. | |
| 3,084,862 A | 4/1963 | Nathan | |
| 3,102,951 A | 9/1963 | Nathan | |
| 3,106,639 A | 10/1963 | Nathan | |
| 3,120,605 A | 2/1964 | Nathan et al. | |
| 3,197,626 A | 7/1965 | Platzer et al. | |
| 3,261,971 A | 7/1966 | Nathan | |
| 3,296,429 A | 1/1967 | Schwartz | |
| 3,304,419 A | 2/1967 | Huntley, Jr. et al. | |
| 3,536,904 A | 10/1970 | Jordan, Jr. et al. | |
| 3,562,553 A | 2/1971 | Roth | |
| 3,621,226 A | 11/1971 | Wittlinger | |
| 3,633,005 A | 1/1972 | Leighton | |
| 3,683,165 A | 8/1972 | Grobert et al. | |
| 3,689,752 A | 9/1972 | Gilbert | |

(Continued)

OTHER PUBLICATIONS

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.

(Continued)

*Primary Examiner* — Peguy Jean Pierre

(57) ABSTRACT

Multipliers are fundamental building blocks in signal processing, including in emerging applications such as machine learning (ML) and artificial intelligence (AI) that predominantly utilize digital-mode multipliers. Generally, digital multipliers can operate at high speed with high precision, and synchronously. As the precision and speed of digital multipliers increase, generally the dynamic power consumption and chip size of digital implementations increases substantially that makes solutions unsuitable for some ML and AI segments, including in portable, mobile, or near edge and near sensor applications. The present invention discloses embodiments of multipliers that arrange data-converters to perform the multiplication function, operating in mixed-mode (both digital and analog), and capable of low power consumptions and asynchronous operations, which makes them suitable for low power ML and AI applications.

26 Claims, 10 Drawing Sheets

(56) References Cited

U.S. PATENT DOCUMENTS

| | | |
|---|---|---|
| 3,838,262 A | 9/1974 | Van De Plassche |
| 4,001,602 A | 1/1977 | Birchenough |
| 4,004,141 A | 1/1977 | Curtis |
| 4,071,777 A | 1/1978 | Herrmann |
| 4,156,283 A | 5/1979 | Gilbert |
| 4,308,471 A | 12/1981 | Misawa |
| 4,353,000 A | 10/1982 | Noda |
| 4,482,977 A | 11/1984 | Ross |
| 4,546,275 A | 10/1985 | Pena-Finol et al. |
| 4,572,975 A | 2/1986 | Bowers |
| 4,586,155 A | 4/1986 | Gilbert |
| 4,677,369 A | 6/1987 | Bowers et al. |
| 4,999,521 A | 3/1991 | Rusznyak |
| 5,107,150 A | 4/1992 | Kimura |
| 5,122,687 A | 6/1992 | Schmidt |
| 5,157,350 A | 10/1992 | Rubens |
| 5,254,889 A | 10/1993 | Han |
| 5,283,579 A | 2/1994 | Tasdighi |
| 5,294,927 A | 3/1994 | Levinson et al. |
| 5,381,352 A | 1/1995 | Shou et al. |
| 5,389,840 A | 2/1995 | Dow |
| 5,495,245 A | 2/1996 | Ashe |
| 5,640,084 A | 6/1997 | Tero et al. |
| 5,668,710 A | 9/1997 | Caliboso et al. |
| 5,703,588 A | 12/1997 | Rivoir et al. |
| 5,734,260 A | 3/1998 | Tasdighi et al. |
| 5,734,291 A | 3/1998 | Tasdighi et al. |
| 5,801,655 A | 9/1998 | Imamura |
| 5,814,995 A | 9/1998 | Tasdighi |
| 5,912,834 A | 6/1999 | Kimura |
| 5,923,208 A | 7/1999 | Tasdighi et al. |
| 6,005,374 A | 12/1999 | Tasdighi |
| 6,054,823 A | 4/2000 | Collings et al. |
| 6,122,284 A | 9/2000 | Tasdighi et al. |
| 6,225,929 B1 | 5/2001 | Beck |
| 6,384,763 B1 | 5/2002 | Leung et al. |
| 6,392,574 B1 | 5/2002 | Toosky |
| 7,024,448 B2 | 4/2006 | Matsugaki et al. |
| 7,136,002 B2 | 11/2006 | Dempsey et al. |
| 7,197,292 B1 | 3/2007 | Kouwenhoven et al. |
| 7,702,716 B2 | 4/2010 | Rösener |
| 7,952,507 B2 * | 5/2011 | Katsis ............... H03M 1/70 341/120 |
| 9,134,739 B2 * | 9/2015 | Kelly ............... H02M 3/156 |
| 9,519,304 B1 | 12/2016 | Far |
| 9,780,652 B1 | 10/2017 | Far |
| 9,793,912 B1 | 10/2017 | Ferris et al. |
| 9,921,600 B1 | 3/2018 | Far |
| 10,101,410 B2 * | 10/2018 | Latham ............ G01R 33/0023 |
| 10,177,713 B1 | 1/2019 | Far |
| 10,198,022 B1 | 2/2019 | Far |
| 2001/0026236 A1 | 10/2001 | Toda |
| 2006/0170580 A1 | 8/2006 | Lauritzen et al. |
| 2013/0293264 A1 * | 11/2013 | Gupta ............... H03K 19/177 326/45 |
| 2015/0091784 A1 | 4/2015 | Kwon et al. |
| 2016/0248437 A1 | 8/2016 | Zhang et al. |

OTHER PUBLICATIONS

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5µW fractional CMOS bandgap voltage and current reference," 2013 IEEE Global High Tech Congress on Electronics, Shenzhen, 2013, pp. 7-11.

A. Far, "A 400nW CMOS bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

A. Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE-Berlin), Berlin, 2015, pp. 310-313.

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2µW half bandgap reference in standard sub-µ CMOS," 2014 IEEE International Conference on Electronics, Computing and Communication Technologies (CONECCT), Bangalore, 2014, pp. 1-5.

A. Far, "Current reference for energy harvesting: 50um per side, At 70 nW, regulating to 125C," 2014 IEEE International Autumn Meeting on Power, Electronics and Computing (ROPEC), Ixtapa, 2014, pp. 1-5.

* cited by examiner

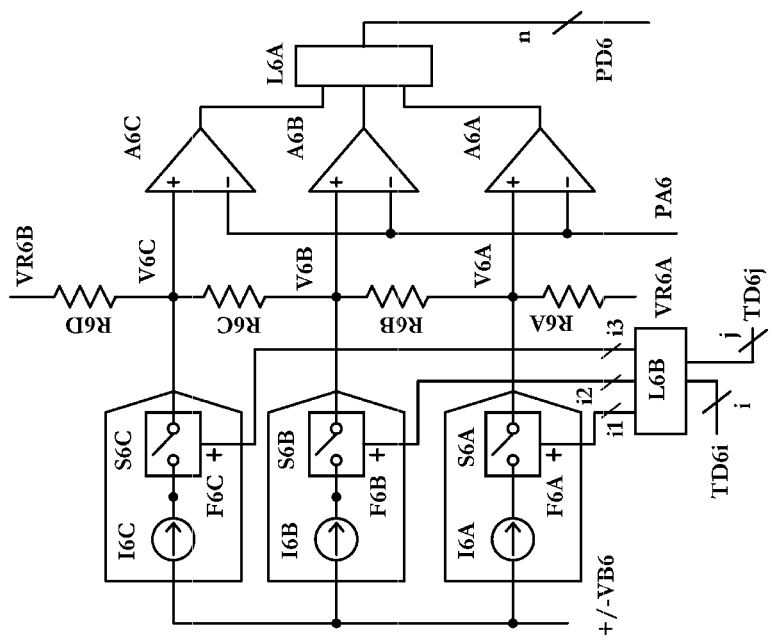
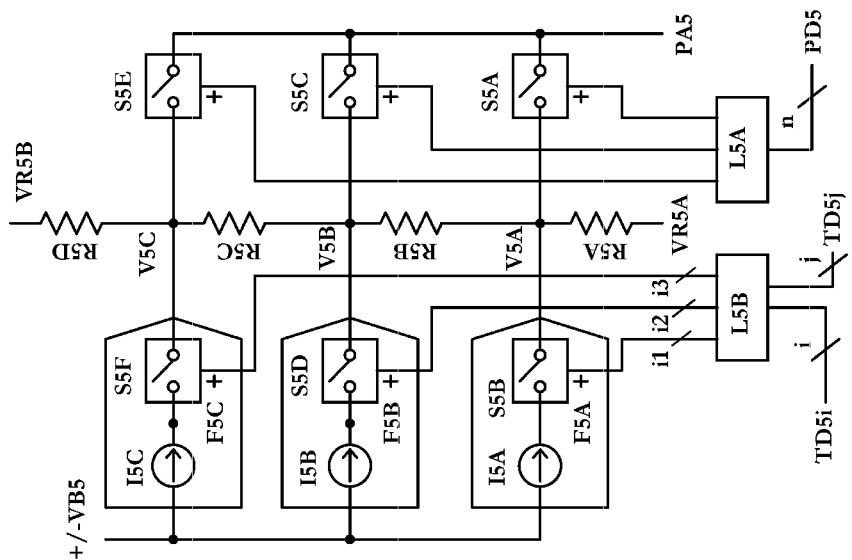
FIG. 6
FIG. 5

MIXED-MODE MULTIPLIERS FOR ARTIFICIAL INTELLIGENCE

CROSS-REFERENCE TO RELATED PATENT APPLICATIONS

The present disclosure claims priority from U.S. Provisional Patent Application Ser. No. 62/658,678 filed Apr. 17, 2018 and which is herein specifically incorporated by reference in its entirety

FIELD OF DISCLOSURE

This disclosure related to improvements in analog, digital, and mixed-mode multipliers for use in integrated circuits (ICs) in general, as well as emerging low power applications including, but not limited to, machine learning and artificial intelligence.

BACKGROUND

The rate of adoption of technology continues to increase in different sectors of the global economy, including consumer, media and communications, industrial, medical, defense, agriculture, financial, and others to name a few. Many technology segments are still at their infancy phase by historic measures, with substantial growth opportunity ahead of them in such application as the internet, social media, virtual and augmented reality, hand-held electronics, smart-phones, internet of things, intelligent robotics (drones), factory automation, electro-medical equipment, electric and autonomous automobiles, crypto-currency, etc.

As a result of this dynamic and expanding technological foot-print globally, the appetite for chips with lower cost, higher performance, high density with more features in small chip area (for high integration), and requiring lower power consumption continues to rise. This dynamic has resulted not only in explosion of number of bits (digital data) but also in the need for higher speed of communication of the digital bits that can be accessible where and when needed.

For the last 40 years, semiconductor manufacturing has been advancing (in accordance with Moore's law predictions) by shrinking fabrication geometries and providing faster transistors with more interconnect layers between them, that has in turn enabled integrated circuits (IC or chips) to be made faster, smaller, denser, and at lower price. For example, there were transistors with channel lengths of 20 micro-meters (1/1000,000 meter) and one interconnect layer about 40 years ago, versus currently when there are 10 nano-meters (1/1000,000,000 meter) transistors that are about 20,000 times smaller and a dozen interconnect layers that can go between them.

The semiconductor manufacturing advancements have in the large part been responsible for delivering chips with fast processing speed, high density and increased levels of feature-function integrations, at declining prices in the last 3 decades that has facilitated technology's volume maximization and mass market adoption. During all this period, data was growing rapidly until the last decade when data growth began to accelerate in the advent of data hungry applications such as the internet and phone and voice-image-video transmissions and recognition, for example, which have currently become main stream and in the hands of consumers via mobile devices, globally.

The technology landscape is currently facing an imperfect storm, where Moore's law is coming to an end. Compared to the past 4 decades, the semiconductor manufacturing's ability is slowing in delivering more cost-power-performance improvements, because in the most part, transistors size reductions are at or near their physical limit at a few nanometers, and all the while the sheer volume of digital data explosion continues.

What has come to help us, in this imperfect storm, are Machine learning (ML) and Artificial Intelligence (AI).

While chip manufacturing has been approaching or nearly running out of steam to handle this data explosion, ML and AI software and digital circuit design methodology can help accelerate and automate some of the data processing at the edge of the network or closer to sensors with an aim to make sense, manage, and crunch this large amount of data before, for example, such massive unmanaged data volumes reach a central office for processing (and in a way, ML and AI act like a filter to zoom on data that matters and get rid of or ignore the rest).

It is likely that without AI and ML technology, the sunset phase of the Moore's law would slow the growth of emerging applications (that have massive amount of data) such as computer vision, data mining, economic and finance, biology, natural language processing, language translation, autonomous car, just to name a few.

AI and ML technologies and applications, although mostly at their infancy stage, could help manage and grow the present data explosion, with less disruption, and accordingly it could facilitate the growth of some of the emerging applications noted above.

However, the energy-inefficiency of purely digital computation chips remain a major concern and hurdle for AI and ML. The power consumption and cost of digital solutions for AI and ML may be excessive and may not fit the bill in some applications, especially at the edge, mobile products, or at sensor levels.

Thus, there could be greater demand for analog and mixed-signal signal processing and implementations, to aid AI and ML digital computations, and offer cost-performance advantages, especially near the edge or access or sensors or mobile gears (e.g., cell phone or robot, etc.) and closer to where and when data is gathered.

For example, while speed and precision of data processing may be most critical for AI and ML systems that are in the cloud and for scientific applications, as stated before, there are needs for AI and ML systems near the edge, access devices, or robotics, for example, where low power consumption and lower cost is most important, and moderate accuracy at lower speeds could be acceptable for the applications and not impractical. Utilization of analog and mixed signal processing (along with digital computation) can help such segments of AI and ML.

One of the aims of the present invention is to provide analog and mixed-mode multiplication solutions for AI and ML applications that require low power.

As it relates to AI and ML, one of the areas that the present invention is addressing is approximate computing where less than perfect precision would suffice. In this segment, analog and mixed-signal implementations can stand on their own to perform the needed computation or alternatively analog and mixed-signal computation solutions can reside in a hybrid computation platform where they can augment the digital computation. The basic premise here is to bargain power consumption and size for quality where decisions are made by examining the statistical attributes of the data.

The motivation to utilize analog (and mixed-signal) here is to harness the faculty of a single analog signal which has the capacity to transfer and or compute a plurality of digital signals in one time cycle and one power cycle, which has the potential for saving area, power (e.g., per computational bit), and cycle time (e.g., clock free asynchronous conversion) when performing a computation.

There are purely analog multiplier solutions applicable to ML and AI. Analog multipliers can operate with low power consumptions and offer low-to-middle precision at low-to-middle speeds. For low power applications, multipliers may be required to operate with one-volt or sub-one-volt power supplies, which renders conventional analog multipliers as impractical given their operating head room requirements. Integrating conventional analog multipliers in digital chip, that are generally noisy, may cause cross talk and hinder such analog multiplier performance.

In this disclosure, it will become clearer that an objective of the disclosed multiplier embodiments is to utilize data converters, including analog-to-digital converters (ADC) and digital-to-analog converters (DAC), in part because they can be ported to conventional digital CMOS manufacturing, and have a seamless interface with digital logic that make the software programmability easier.

Another objective of this disclosure is that performing the AI function using analog and mixed signal solutions versus purely digital solutions could help reduce the software instructions set, size of memory, and reduce the rate of interface between AWL engines and memory/data which can potentially lower dynamic power consumption and the total system cost for some applications.

Another objective is of this disclosure is that the data converter's reference networks can be programmed to approximate non-linear input-to-output transfer functions (e.g., logarithmic, square, etc.), which makes them suitable for approximate multipliers that can be utilized for approximate computation to save on power consumption and circuit cost. It is of note that the ability of efficient (low power, small area) analog or mixed signal computation deteriorates as the accuracy requirements increase, which is why the proposed invention would benefit the approximate computing, suitable in some segments in artificial intelligence applications with mid-range accuracy requirement.

Another objective of the disclosed invention is that plurality of multipliers (utilizing plurality of data-converters) that share the same reference network (or use copies of the same reference network) could lower power consumption, reduce chip area as well as improve matching between multipliers (via its data-converters) channels. This feature would provide system level flexibility, including cost effective or global trimming to improve system accuracy.

Another objective of this disclosure is that multipliers, utilizing data converters, are capable of operating free of clock (asynchronously), which is also required for some ML and AI applications. Moreover, clock free operations substantially reduce dynamic power consumption that is associated with computation chips that require always on clocks.

Another objective of the disclosed invention is that by retaining the accuracy, but reducing the resolution of data-converters disclosed here (e.g., a converter with 4-bits of resolution that is 8-bit accurate), generally would result in saving on chip area and lowering of power consumption. Accordingly, this invention discloses methods of disassembling the inputs signals before they are multiplied into segments with lower resolutions but retaining their accuracy. Then, performing the multiplication on the segments instead of the whole input signals, applying principles such as segmentation while utilizing a combination of purely digital functions and low-resolution data converters.

Another objective of the disclosed invention is that the mixed-mode and analog signal processing solutions whose zero-scale to full-scale dynamic ranges are not limited to high or low currents. For example, some analog signal processing units (e.g., multipliers) rely on operating transistors in the subthreshold regions which restricts the dynamic range of analog signal processing units (e.g., the multiplier) to low current. Also, some other analog signal processing units (e.g., multipliers) rely on operating transistors in the saturation regions which restricts the dynamic range of analog signal processing units (e.g., the multiplier) to higher current.

In summary, the objective of the disclosed invention suitable for ML and AI applications are to provide multipliers that (a) are compatible with main-stream digital CMOS manufacturing, (b) can operate with low power supplies, (c) can operate mixed-mode, enabling the multiplier to be seamlessly integrated on large digital chips, (d) are capable of utilizing approximate multiplication which can provide cost-performance advantages and greater degree of trade-off flexibility (e) can operate asynchronously (e) offer low power consumption which providing low-to-moderate speeds and moderate-to-high precision needed for some segments of the ML and AI.

BRIEF DESCRIPTION OF THE DRAWINGS

FIG. 5 is a simplified circuit schematic diagram illustrating embodiment of a DAC with field programmable or real-time programmable transfer function network.

FIG. 6 is a simplified circuit schematic diagram illustrating embodiment of an ADC with field programmable or real-time programmable transfer function network.

SUMMARY OF THE DISCLOSURE

Figure 4:
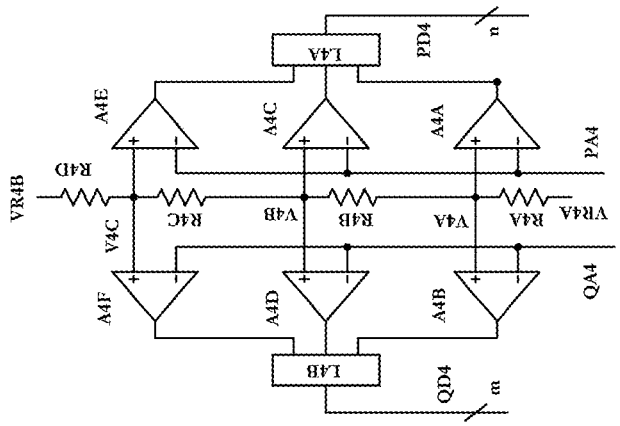
FIG. 4 is a simplified circuit schematic diagram illustrating two ADCs that share the same transfer function network wherein the transfer function network is a R-string.

An aspect of the present disclosure is a method of operating a multiplier by utilizing mixed-mode data converters circuits, the method comprising: operating the data converters (clock free) asynchronously to provide asynchronous multiplication. Further aspect of the present disclosure is a method of operating a multiplier by utilizing mixed-mode data converters circuits, the method comprising: sharing the data converters reference network among plurality of data converters. Further aspect of the present disclosure is a method of operating a multiplier by utilizing mixed-mode data converters circuits, the method comprising: programming the data converter's reference network that utilizes at least one of resistors and current sources to arrange the data-converter's transfer function. Further aspect of the present disclosure is a method of operating a multiplier by utilizing mixed-mode data converters circuits, the method comprising: programming the data converters reference network to follow at least one of logarithmic and square function input-output transfer functions. Further aspect of the present disclosure is a method of operating a multiplier by utilizing a pair of mixed-mode data converters circuits, the method comprising: performing multiplication by summing the outputs of the pair of data converters whose input-output transfer functions are programmed logarithmically. Further aspect of the present disclosure is a method of operating a multiplier by utilizing a pair of mixed-mode data converters circuits, the method comprising: performing multiplication by subtracting an absolute value of square of sum of input signals from square of absolute value of subtraction of the input signals, wherein input-output transfer functions of the pair of data converters are programmed square function.

Another aspect of the present disclosure is a method of modifying the transfer function of a data converter, the method comprising: providing a first data converter having a first reference network defining a first input-to-output transfer function, wherein the first reference network may be shared among a plurality of data converters; and programming the first reference network to modify the first input-to-output transfer function. Further aspects of the disclosed method of modifying the transfer function of a data converter herein include the method further comprising: constructing the first reference network using one or more resistive elements; and programming the one or more resistive elements to modify first input-to-output transfer function. Further aspects of the disclosed method of modifying the transfer function of a data converter herein include the method further comprising: constructing the first reference network using one or more current sources; and programming the one or more current sources to modify first input-to-output transfer function. Further aspects of the disclosed method of modifying the transfer function of a data converter herein include the method further comprising: constructing the first reference network using one or more switched capacitor; and programming the one or more switched capacitors to modify first input-to-output transfer function. Further aspects of the disclosed method of modifying the transfer function of a data converter herein include the method further comprising: programming the first reference network such that the first input-to-output transfer function approximating a square function. Further aspects of the disclosed method of modifying the transfer function of a data converter herein include the method further comprising: applying a first input signal P to a first input port of the first data converter; and generating, at a first output port of the first data converter, a first product approximating the square of P. Further aspects of the disclosed method of modifying the transfer function of a data converter herein include the method further comprising: programming the first reference network such that the first input-to-output transfer function approximating a logarithmic function. Further aspects of the disclosed method of modifying the transfer function of a data converter herein include the method further comprising: applying a first input signal P to a first input port of the first data converter; and generating, at a first output port of the first data converter, a first product approximating the logarithm of P.

Another aspect of the present disclosure is a method of multiplying signals utilizing data converters, the method comprising: applying a first input signal (P) to a first input port of a first analog-to-digital converter (ADC); applying plurality (z) of input signals ($Q_Z$) to plurality of reference ports ($R_Z$) of plurality of digital-to-analog converters ($DAC_Z$); coupling a first output port of the first ADC to plurality of digital input ports of the plurality of $DAC_Z$s; and generating plurality of products at plurality of analog output ports of the plurality of $DAC_Z$s, wherein the plurality of products are multiplications of the P signal by the plurality of $Q_Z$ signals. Further aspects of the disclosed the method of multiplying signals, the method further comprising: operating the first ADC in current mode. Further aspects of the disclosed the method of multiplying signals utilizing data converters, the method further comprising: operating the plurality of $DAC_Z$s in current mode.

Another aspect of the present disclosure is a method of multiplying signals utilizing data converters, the method comprising: adding a first signal P to a second signal Q to generate a first intermediate sum P+Q and generating absolute value of the P+Q; subtracting the second signal Q from the first signal P to generate a first intermediate difference P−Q and generating absolute value of the P−Q; programming a first data converter and a second data converter such that the respective input-to-output transfer functions of the first and the second data converters each approximates a square function; coupling absolute value of the P+Q to a first input port of the first data converter to generate a first approximate product $(P+Q)^2$; coupling the absolute value of the P−Q to a first input port of the second data converter to generate a first approximate product $(P-Q)^2$; subtracting $(P-Q)^2$ from $(P+Q)^2$ to generate a difference signal 4×P×Q; and scaling the difference signal 4×P×Q to generate a resultant P×Q. Further aspects of the disclosed the method of multiplying signals utilizing data converters, the method further comprising: utilizing data converters comprising resistive elements; and sharing the resistive elements among a plurality of data converters. Further aspects of the disclosed the method of multiplying signals utilizing data converters, the method further comprising: utilizing current mode data converters. Further aspects of the disclosed the method of multiplying signals utilizing data converters, the method further comprising: utilizing algorithmic data converters.

Another aspect of the present disclosure is a method of multiplying signals utilizing data converters, the method comprising: programming a first data converter and a second data converter such that the respective input-to-output transfer functions of the first and the second data converters each approximates a logarithmic function; coupling a first signal P to the first data converter to generate a first approximate product log P coupling a second signal Q to the second data converter to generate second approximate product log P; and adding log P to log Q to generate a first product log(P×Q). Further aspects of the disclosed the method of multiplying signals utilizing data converters, the method further comprising: programming a third data converter such that its input-to-output transfer functions approximates an anti-logarithmic function; and coupling the first product log(P×Q) to the input of the third data converter to generate a second product P×Q. Further aspects of the disclosed the method of multiplying signals utilizing data converters, the method further comprising: utilizing data converters comprising input-to-output transfer functions that utilize resistive elements; programming the resistor elements to program the data-converter's input-to-output transfer functions to approximate at least one of logarithmic or anti-logarithmic functions; and sharing the resistive elements among a plurality of data converters. Further aspects of the disclosed the method of multiplying signals utilizing data converters, the method further comprising: utilizing current mode data converters. Further aspects of the disclosed the method of multiplying signals utilizing data converters, the method further comprising: utilizing algorithmic data converters.

Another aspect of the present disclosure is a method of multiplying signals utilizing data converters, the method comprising: segmenting a first signal P into a first most significant portion MP and a first least significant portion LP; segmenting a second signal Q into a second most significant portion MQ and a second least significant portion LQ; multiplying MP by MQ to produce a first product MP×MQ; multiplying MP by LQ to produce a second product MP×LQ; multiplying MQ by LP to produce a third product MQ×LP; wherein at least one of the multiplying MP by MQ, multiplying MP by LQ, and multiplying MQ by LP, is performed in a mixed mode multiplication; and scaling and combining the first, second, and third products to generate a first final product P×Q of the first signal P and the second signal Q. Further aspects of the disclosed the method of multiplying signals utilizing data converters, the method further comprising: multiplying LP by LQ to produce a fourth product LP×LQ; and scaling and combining the fourth product with the first final product. Further aspects of the disclosed the method of multiplying signals utilizing data converters, the method further comprising: performing the mixed mode multiplication utilizing at least one multiplying digital to analog converter. Further aspects of the disclosed the method of multiplying signals utilizing data converters, the method further comprising: wherein the multiplying digital to analog converter operates in current mode. Further aspects of the disclosed the method of multiplying signals utilizing data converters, the method further comprising: performing the mixed mode multiplication utilizing at least one multiplying analog to digital converter. Further aspects of the disclosed the method of multiplying signals utilizing data converters, the method further comprising: the segmenting of the first signal P is performed in a first analog to digital converter, wherein the first most significant portion MP is digital and the first least significant portion LP is analog; and the segmenting of the second signal Q is performed in a second analog to digital converter, wherein the second most significant portion MQ is digital and the second least significant portion LQ is analog. Further aspects of the disclosed the method of multiplying signals utilizing data converters, the method further comprising: wherein the first analog to digital converter operates as an algorithmic analog to digital converter. Further aspects of the disclosed the method of multiplying signals utilizing data converters, the method further comprising: wherein the second analog to digital converter operates as an algorithmic analog to digital converter. Further aspects of the disclosed the method of multiplying signals utilizing data converters, the method further comprising: the multiplying MP by LQ to produce the second product MP×LQ is performed in a first multiplying digital to analog converter; and the multiplying MQ by LP to produce the third product MQ by LP is performed in a second multiplying digital to analog converter. Further aspects of the disclosed the method of multiplying signals utilizing data converters, the method further comprising: the multiplying MP by MQ to produce the first product MP×MQ is performed in a first digital multiplier.

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Note that all the figures comprised of circuits, blocks, or systems illustrated in this disclosure are powered up by positive and negative power supplies, VDD and VSS (and VSS can be connected to the ground potential or zero volts for single supply applications), respectively (unless otherwise specified), and they are not shown for illustrative clarity of the disclosed figures. Terms FET is field-effect-transistor; MOS is metal-oxide-semiconductor; MOSFET is MOS FET; PMOS is p-channel MOS; NMOS is n-channel MOS; BiCMOS is bipolar CMOS; residual LSP of a signal is residual least significant portion of the signal and MSP of the signal is most significant portion of the signal where the sum of the MSP of the signal plus the residual LSP of the signal are equal to the whole signal and the MSP or residual LSP can be represented in analog or digital form or combination thereof.

All the data-converters including, analog-to-digital converters (ADC) as well as digital-to-analog converters (DAC) may not show (for illustrative clarity) a positive reference and a negative reference input, where the negative reference input can be connected to the ground potential or zero volts.

Throughout this disclosure, data-converter that are otherwise illustrated with a 2-bits of resolution for demonstrative and descriptive clarity, can have higher resolution, unless otherwise specified (e.g., utilized data-converters can have higher resolutions where 16-bits of resolution is practical). Also, for descriptive clarity some illustrations are simplified, where their improvements would be obvious to one skilled in the arts. For example, some circuit schematics are show current sources or mirrors utilizing one FET. In such instances, FETs can instead be cascaded to improve the performance of current sources such as increasing their output impedance. In some instances, analog switches are shown as single FETs with one input, one output, and a control input. In such instances, the one FET acting as a switch can be replaced with two FETs with a common input but opposite control polarity to manage the switch input's on and off voltage span and improve on-off glitch transients. Also note that other manufacturing technologies, such as Bipolar, BiCMOS, and others can utilize the disclosure in whole or part.

Also, for illustrative clarity, some of the data-converters in this disclosure are shown as sharing their transfer function network with only one other data-converter. The same transfer function network can be shared with more than two data-converters and the data-converters sharing the same transfer function network can be plurality of DACs, or plurality of ADCs, or combination of either's plurality of DACs or plurality of ADCs. Data-converters utilizing a resistor string network or switched-capacitor network to arrange their transfer function network, can share their transfer function amongst plurality of data-converters, unless otherwise specified.

In this disclosure, unless otherwise specified, the illustrated data-converters are generally asynchronous (i.e., they are clock free) which eliminates the need for a free running clock and improves dynamic power consumption with lower clock noise.

Note that the methods, systems, or circuits disclosed generally are applicable to data-converters that are synchronous (i.e., requiring clocks). For example, the comparators in the ADC, can be designed with lower offset and lower noise utilizing switched capacitors topologies. Also, instead of utilizing a resistor string to arrange the data-converters transfer function network, switched capacitor network can be utilized and they be shared amongst plurality of other data-converters.

For illustrative clarity, for n-bit data-converters that utilize resistor strings as their transfer function reference network, $2^{n-1}$ switches and the respective $2^{n-1}$ decoding or encoding logic control lines are shown to tap directly into each resistor along a resistor string. For higher resolution data-converters, to reduce the output routes of decoders or encoder and to reduce the chips area associated with the digital word bit width of $2^{n-1}$ that selects $2^{n-1}$ switches, there are other alternatives embodiments. For example, in case of a resistor string voltage DAC, a mux-tree with cascaded layers of switches (that technically perform the function of analog decoding instead of digital decoding) where each layer of the mux-tree is supplied with the data-converters n-bit digital binary input word instead of the decoded or encoded $2^{n-1}$ bits.

Throughout this disclosure, data-converters and multipliers that operate in current mode generally have the following benefits: First, data-converters and multipliers operating in current mode are inherently fast. Second, current signal processing that occurs within the nodes of data-converters and multipliers, generally, have small voltage swings which enables operating the current mode data-converters and multipliers with lower power supply voltages. Third, operating at low supply voltage reduces power consumption of current mode data-converters and multipliers. Fourth, summation and subtraction functions in analog current mode is generally simple and takes small chip area. For example, summation of two analog currents could be accomplished by coupling the current signals. Depending on accuracy and speed requirements, subtraction of analog current signals could be accomplished by utilizing a current mirror where the two analog current signals are applied to the opposite side of the current mirror, for example.

Figure 1:
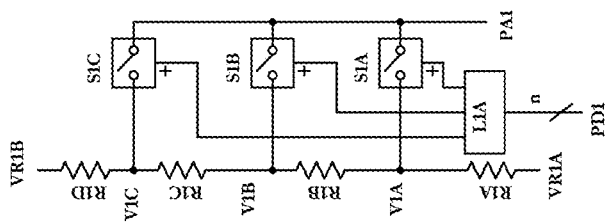
FIG. 1 is a simplified circuit schematic diagram illustrating a DAC utilizing a resistor string (R-string).

Section 1—Description of FIG. 1

FIG. 1 is a simplified DAC circuit schematic whose reference network is constructed using a resistor string ($R_{1A}$, $R_{1B}$, $R_{1C}$, $R_{1D}$). The resistor string reference network generates the transfer function of a data-converter. The embodiment illustrated in FIG. 1 is arranged such that the resistors in the reference resistor string are selectively programmed in order to program the transfer function of the data-converter to, for example, follow a non-linear profile such as a square or logarithmic function. For descriptive clarity, the DAC in FIG. 1 is illustrated with only n=2 which is two bits of resolution. The DAC's resistor string in FIG. 1 generates voltage taps ($V_{1A}$, $V_{1B}$, $V_{1C}$) that are selected by the DAC's digital input word, $P_{D1}$. The digital selection of respective switches is accomplished via decoding the $P_{D1}$ input bits which are applied to a logic decoder, $L_{1A}$, whose decoded digital outputs select the switches ($S_{1A}$, $S_{1B}$, $S_{1C}$). The said switches pass the selected resistor string's voltage taps ($V_{1A}$, $V_{1B}$, $V_{1C}$) that follow a programmed profile to the DAC's analog output port, $P_{A1}$. Generally, for a DAC with n-bits of resolution, the $L_{1A}$ would be a logic decoder that receives the DAC digital inputs as being n-bit wide, and the decoder $L_{1A}$ digital output word would be $2^{n-1}$ wide. Similarly, there would be $2^{n-1}$ programmed voltage taps along the resistor string which are digitally selected by the $2^{n-1}$ switches. The top reference input port $VR_{1B}=VR_+$ and the bottom reference input port $VR_{1A}=VR_-$. The upper voltage reference $VR_+$ or full scale, and the lower reference voltage $VR_-$ or zero scale, establish the range of reference voltage. As such, $VR_+$ and $VR_-$ determine the DAC analog output range spanning from zero-scale to full-scale, respectively. Note that $VR_-$ can be connect to the ground or zero voltage.

In a general, the output voltage of a linear DAC can mathematically be expressed as $V_o=V_R\times\Sigma_{i=1}^{n}D_i\times 2^{i-1}$ where $V_o$ is the analog output voltage of the DAC, $V_R$ is the $VR_+$ reference voltage, n is the resolution of the DAC and $D_i$ is 0 or 1 representing the value of the $i^{th}$ digital input bits of the DAC.

As noted earlier, for the DAC embodiment illustrated in FIG. 1, each of the resistors in the resistor string network of the DAC are be programmed to different values which arranges the DAC's reference network to follow a non-linear transfer function profile. An example to attain a non-linear transfer function for a DAC is (an approximate) logarithmic digital input to analog output transfer function, which hereafter is called proximate logarithmic DAC. The mathematical expression for a logarithmic DAC can be approximately represented with $\Sigma_{i=1}^{n}D_i\times 2^{i-1}\approx \text{Log}(V_o/V_R)$. In other words, for FIG. 1, $\text{Log}(P_{A1})\approx f(P_{D1})$ where $f$ is a transfer function, $P_{A1}$ represent the analog form of a signal P, and $P_{D1}$ represent the digital form of the signal P.

In other embodiment of the FIG. 1, the DAC's resistor string, which establishes the transfer function of the data-converter, can be programmed to other non-linear profiles such a square transfer function. As such, an approximate digital input to square analog output transfer function would follow a square function profile. The mathematical expression for a square DAC can be approximately represented with $\Sigma_{i=1}^{n}D_i\times 2^{i-1}\approx(V_o/V_R)^2$. In other words, $(P_{A1})^2\approx f(P_{D1})$, which henceforth is called proximate square DAC.

To save on chip area and achieve higher resolutions, a sub-ranging DAC can be arranged. A sub-ranging DAC (e.g., with 8-bits of resolution) comprising of an MSB DAC is supplied with the MSB bank of the digital word (e.g., first 4 MSBs), and an LSB DAC is supplied with the LSB bank digital word (e.g., the last 4 LSBs). The MSB bank would utilize a first resistor string that is programmed to be non-linear to generate a non-linear transfer function such as, for example, logarithmic or square transfer function profiles. The LSB DAC, with for example 4-bit of resolution, can be a linear binarily weighted DAC utilizing for example a second resistor string (with equal sized resistors in the resistor string) or a conventional linear R2R DAC. As such, the linear LSB DAC (while properly buffered to avoid loading errors into the MSB DAC) could linearly extrapolate between the non-linear MSB DAC sub-ranges. Accordingly, a proximate non-linear DAC is arranged having for example, a proximate logarithmic or square transfer function profiles.

Some of the benefits of embodiment in FIG. 1 are chiefly in its usage and combination in a mixed mode multiplier system which are (1) the ability to program an approximate non-linear digital input to analog output transfer function such as for example logarithmic or square functions, and (2) the same approximate input-to-output transfer function can be shared between plurality of data-converters for better matching between the data-converter channels and save on power consumption and attain smaller chip area.

Figure 2:
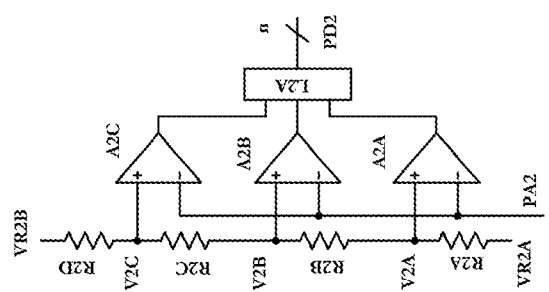
FIG. 2 is a simplified circuit schematic diagram illustrating an ADC utilizing a R-string.

Section 2—Description of FIG. 2

FIG. 2 is a simplified 2-bit ADC schematic whose reference network is also constructed using a resistor string ($R_{2A}$, $R_{2B}$, $R_{2C}$, $R_{2D}$). The embodiment illustrated in FIG. 2 is arranged such that the resistors in the reference resistor string are selectively programmed in order to program the transfer function of the data-converter to, for example, follow a non-linear profile. For clarity, the ADC in FIG. 2 is illustrated with n=2 bits of resolution and it is comprised of $2^{n-1}$ comparators $A_{2A}$, $A_{2B}$, and $A_{2C}$. The ADC's comparators compare the analog input signal $P_{A2}$ with the respective voltage taps along the resistor string $2^{n-1}$, which in the case of FIG. 2. are $V_{2A}$, $V_{2B}$, and $V_{2C}$, respectively. Accordingly, a digital word is generated at the output of the $2^{n-1}$ comparators ($A_{2A}$, $A_{2B}$, and $A_{2C}$). The digital outputs of the said comparators are applied to a logic encoder, $L_{2A}$, which generates the ADC's digital output signal word $P_{A2}$ where the digital output word in n-bit wide. As noted, for an ADC with n-bits of resolution, there would be $2^{n-1}$ programmed voltage taps along the reference resistor string network. Similarly, there would be $2^{n-1}$ comparators whose first input receives $P_{A2}$ and input of each of $2^{n-1}$ other comparators are connected to the respective $2^{n-1}$ programmed voltage taps along the reference resistor string network. The upper port of the resistor string $VR_{2B}=VR_+$ and the lower port of the resistor string $VR_{2A}=VR_-$ are applied to the resistor string network to set the upper reference voltage $VR_+$ or full scale of ADC and the lower reference voltage $VR_-$ or zero scale of the ADC. As such, $VR_+$ and $VR_-$ determine the ADC's input voltage ($P_{A2}$) range spanning from zero-scale to full-scale, respectively. Note that $VR_-$ can be connected to the ground or zero voltage.

In a typical linear ADC configuration, a general mathematical expression for an ADC's transfer function can be approximately represented as $Do_{1\to n}=(2^n \times V_{IN})/V_{REF}$ where $Do_{1\to n}$ is the ADC's digital output word that is n-bit wide (including $Do_1$ as the LSB to $Do_n$ as the MSB), $V_{IN}$ is the ADC's analog input voltage, and $V_{REF}$ is the ADC's reference voltage (where $VR_{2B}=VR_+$ and $VR_{2A}=VR_-=0$). Note that an input voltage increments applied to the analog input terminal of the ADC, corresponds to an LSB weight of $V_{REF}/2^n$.

In the embodiment illustrated in FIG. 2, each of the resistors in the resistor string network of the ADC can be programmed to different values to enable the data-converter to follow a non-linear transfer function profile. For example, an approximate logarithmic ADC, the analog input to digital output transfer function can be fashioned by proper programming the data-converter's reference network (in this case programming the value of resistors in the resistor string, which is the data-converters reference network) to follow an approximate logarithmic profile, which hereafter is called proximate logarithmic ADC. As noted earlier, the analog input to digital output transfer characteristics of a logarithmic ADC can approximately be expressed as $\log(P_{D2}) \approx f(P_{A2})$.

In other embodiment of the FIG. 2, the ADC's resistor string can also be programmed to other non-linear profiles such a square transfer function. For example, an approximate analog input to square digital output transfer function can be arranged. In other words, $(DO_{2A})^2 \approx f(VI_{2A})$, which henceforth is called proximate square ADC.

To save on area and achieve higher resolutions, a sub-ranging or 2-step ADC can be arranged. A sub-ranging ADC (e.g., with 8-bit of resolution) comprising of a MSB ADC that generates the MSB bank of the digital output word (e.g., first 4 MSBs), and a LSB ADC that generates the LSB bank digital output word (e.g., the last 4 LSBs). The MSB non-linear ADC would utilize a first resistor string that is programmed to be non-linear to generate a non-linear MSB transfer function such as, for example, logarithmic or square transfer functions. The LSB ADC can be a linear binarily weighted ADC. As such, the linear LSB ADC would linearly extrapolate between the non-linear MSB sub-ranges, where the subranges are programmed by the non-linear MSB ADC. Accordingly, a proximate non-linear ADC is arranged having for example, a proximate logarithmic or square transfer function profiles.

Some of the benefits of embodiment in FIG. 2 is in its utilization and combination in a mixed mode multiplier system are (1) ability to program an approximate non-linear analog input to digital output transfer function such as for example logarithmic and square, and (2) share the same approximate input-to-output transfer function network between multiple data-converters that are utilized in mixed-mode multiplier system for better matching between channels and to save on power consumption and attain smaller chip area.

Figure 3:
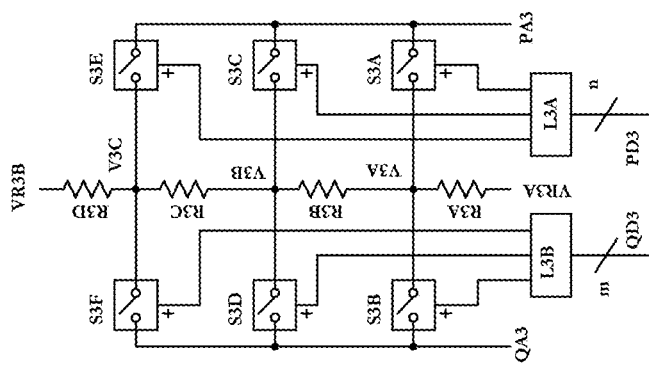
FIG. 3 is a simplified circuit schematic diagram illustrating two DACs that share the same transfer function network wherein the transfer function network is a R-string.

Section 3—Description of FIG. 3

FIG. 3 is a simplified schematic comprising of two DACs (e.g., P DAC and Q DAC), where each of the P and Q DACs have the topology described in FIG. 1 of section 1, where in FIG. 3. the same programmed transfer function network is shared between the two DACs. The embodiment illustrated in FIG. 3, similar to the one in FIG. 1, is arranged such that the resistors in the reference resistor string are selectively programmed in order to program the transfer function of the data-converter to, for example, follow a non-linear logarithmic or square function profile. Additionally, the input-to-output transfer functions, between the two DACs, match since they are derived from the same transfer function network. Besides better matching, sharing the same transfer function network between the two DACs saves on chip area and power consumption, which is a key requirement for low-power and low-cost and high-volume applications. Moreover, the shared transfer function via the resistor string would allow for one system-wide correction (e.g., calibration or trimming the resistor string) to further improve accuracy, such as in gain error or offset. The input signals of the P and Q data-converters are $P_{D3}$ and $Q_{D3}$ respectively (when the digital inputs of the two DACs are n-bit and m-bit wide, respectively) and the output signal of the two DACs are $P_{A3}$ and $Q_{A3}$, respectively. In the illustration of FIG. 3 the (bits) words width n and m of the P and Q DACs are the same, but they can be arranged to have different digital word widths. The positive reference voltage is supplied to $VR_{3B}$ and the negative reference voltage is supplied to $VR_{3A}$.

Let's consider applying two digital words, $P_D$ and $Q_D$, respectively to the two inputs of the two DAC embodiments illustrated in FIG. 3, where the shared reference network of the two DACs is programmed to follow an approximate logarithmic profile. Accordingly, the analog outputs of the two DACs can be summed together which would result in the equivalent of $\log(P_A \times Q_A)$. Here, $P_A$ and $Q_A$ are the analog output representations of $P_D$ and $Q_D$ digital input word signals, respectively. This is the case because $\log(P_D) + \log(Q_D) = \log(P_A \times Q_A)$.

The benefits of embodiment of FIG. 3 are the following: By utilizing mixed-mode data-converters whose transfer functions are programmed to follow a logarithmic profile, the multiplication of two digital words $P_D$ and $Q_D$ (is performed in the logarithmic domain). As such, the realization of the multiplication function as performed by the circuit schematic embodiment illustrated in FIG. 3 can be simplified to an addition operation of the two output of the two respective non-linear (logarithmic) DACs. Moreover, the sharing of the same proximate logarithmically programmed transfer function network (e.g., the sharing of the same resistor string network that is programmed logarithmically) between the two DACs saves chip area, reduces power consumption, and improves matching between the transfer function of the two logarithmic DACs which in turn would improve the accuracy of the mixed-mode multiplier. Also, the multiplication process can be performed asynchronously. A such, when the digital inputs $P_D$ and $Q_D$ are applied to the two logarithmic DAC inputs, then the summation of the two logarithmic DAC outputs generates the analog logarithmic multiplication equivalent of $P_A \times Q_A$ without any clock delay. The response time of the digital input to analog output of this mixed mode multiplier is generally dominated by the response time of the logarithmic DAC and the analog addition function delay for the two analog logarithmic outputs.

Let's now consider the summation and subtraction of $P_D$ and $Q_D$ (which are the two input digital words $P_D+Q_D$ and $P_D-Q_D$, respectively) being applied to the two input ports of the two DAC embodiments illustrated in FIG. 3, whose transfer function (i.e., the resistor string network) is programmed to follow an approximate square function. Subsequently, the analog outputs of the two DACs can be subtracted from one another which would result in the equivalent of $4 \times P_A \times Q_A$. Here, $P_A$ and $Q_A$ signals are the analog output representations of $P_D$ and $Q_D$ digital inputs, respectively. This is the case because $(P_D+Q_D)^2-(P_D-Q_D)^2 \approx 4 \times P_A \times Q_A$.

Additionally, the benefits of the embodiment illustrated in FIG. 3 are the following: As it can be seen by utilizing non-linear mixed-mode data-converters, whose transfer functions are programmed to follow a square function profile, the multiplication of two digital signals $P_D$ and $Q_D$ is made efficient by being simplified to a subtraction operation of the two analog outputs of the two respective non-linear (square) DACs. Moreover, the sharing of the same proximate square programmed transfer function network (e.g., the sharing of the same resistor string network that is programmed to follow a square profile) between the two square DACs saves chip area, lowers power consumption, and improves matching between the transfer function of the two square DACs which improves the accuracy of the mixed-mode multiplier. Moreover, the multiplication process is made asynchronously. When the digital input words $P_D$ and $Q_D$, are applied to the two square DAC inputs, then the subtraction of the two square DAC outputs that generate the analog multiplication equivalent of $4 \times P_A \times Q_A$ is generated without clock delay. The response time of the digital input to analog output is generally dominated by the response time of the square DAC and the subtraction of the two analog outputs of the square DACs.

Section 4—Description of FIG. 4

FIG. 4 is a simplified schematic circuit diagram illustrating two ADCs (e.g., P ADC and Q ADC) share the same transfer function network wherein the transfer function network is a resistor string. The P and Q ADCs illustrated in FIG. 4 are arranged similar to that of the ADC topology described in FIG. 2 of section 2. Similar to FIG. 2, the embodiment illustrated in FIG. 4 programs the resistors in the reference resistor string in order to arrange the transfer function of the data-converter to follow a non-linear profile, for example such as logarithmic or square function. In FIG. 4, the same resistor string is shared between the two ADCs, which saves chip area and lowers power consumption. Moreover, the two ADC's matching with one another is improved since any imprecision is derived from the same shared transfer function network. Also, note that the shared transfer function via the resistor string would allow for one system-wide correction (e.g., calibration or trimming the resistor string) to further improve accuracy, such as in gain error or offset. The analog input of the P ADC is $P_{AA}$ and the analog input of the Q ADC is $Q_{AA}$. The digital output of the P ADC, that is n-bit wide is $P_{D4}$. The digital output of the Q ADC, that is m-bit wide, is $Q_{D4}$. In the illustration of FIG. 4, the bit words n and m of the P and Q ADCs are the same, but they can be arranged to have different bit-widths. The positive reference voltage is supplied to $VR_{4B}$ and the negative reference voltage is supplied to $VR_{4A}$ (which can be set to zero potential or ground).

Let's consider applying two analog inputs, $P_A$ and $Q_A$, respectively to the two ADC embodiments illustrated in FIG. 4, where the shared reference network of the two ADCs is programmed to follow an approximate logarithmic function. Accordingly, the digital output generated at the output of the two ADCs can be added together in the digital domain which would result in the equivalent of Log $(P_D \times Q_D)$. This is the case because Log $(P_D)$+Log $(Q_D)$ Log $(P_D \times Q_D)$. As it can be seen by utilizing mixed-mode data-converters, whose transfer functions are programmed to follow a logarithmic profile, the multiplication of two analog signals $P_A$ and $Q_A$ (is performed in the logarithmic domain and it) is simplified to a low cost simple and fast addition of two digital output words of the logarithmic ADCs. Moreover, the sharing of the same proximate logarithmically programmed transfer function network between two ADCs would saves on chip area, lowers power consumption, and improves matching between the transfer function of the two logarithmic ADCs which improved the accuracy of the mixed-mode multiplier. Moreover, the multiplication process is asynchronous. When the analog inputs $P_A$ and $Q_A$, are applied to the two logarithmic ADCs, then the summation of the two ADC digital outputs is the logarithmic multiplication equivalent of $P \times Q$ which can be generated without clock delay. The response time of the analog input to digital output of such mixed-mode multiplier is generally dominated by the response time of the logarithmic ADC.

Let's now consider the summation and subtraction of $P_A$ and $Q_A$ (which are the two input analog signals $P_A+Q_A$ and $P_A-Q_A$, respectively) being applied to the two inputs of the two ADCs embodiments illustrated in FIG. 4, whose transfer function (i.e., the resistor string network) is programmed to follow an approximate square function. Subsequently, the digital outputs of the two ADCs can be subtracted from one another, in the digital domain, which would result in the equivalent of $4 \times P_D \times Q_D$. Here, $P_A$ and $Q_A$ are the analog input signal's representations of the $P_D$ and $Q_D$ digital output words, respectively. This is the case because $(P_A+Q_A)^2-(P_A-Q_A)^2 \approx 4 \times P_D \times Q_D$. Note that since the $P_A-Q_A$ results and $P_A+Q_A$ results are taken to the power of two, the sign of the said square results is always positive, and thus simplifying the implementation of the functions of summation and subtraction of $P_A$ and $Q_A$. As it can be seen by utilizing proximate square transfer function mixed-mode data-converters, the multiplication of two analog words $P_A$ and $Q_A$ that is performed in the square domain is efficient and simplified to a subtraction operation of the two digital output words of the two respective non-linear (square) ADCs. Moreover, the sharing of the same proximate square programmed transfer function network between the two ADCs saves chip area, reduces power consumption, and improves matching between the transfer function of the two square ADCs which improves the accuracy of the mixed-mode multiplier. Moreover, the multiplication process is asynchronous. When the analog inputs $P_A$ and $Q_A$, are applied to the two proximate square ADC's analog inputs, then the subtraction of the two square ADC's digital output words generate the digital multiplication equivalent of $4 \times P_D \times Q_D$ which is generated without clock delay. The response time of the analog input signal to digital output word is generally dominated by the response time of the proximate square ADC.

Section 5—Description of FIG. 5

FIG. 5 is a simplified circuit schematic diagram illustrating embodiment of a DAC with field programmable or real-time programmable transfer function network. To the right-hand side of the resistor string in FIG. 5 is a main DAC similar to the one described in FIG. 1 of section 1. The main DAC's n-bit wide digital input word is $P_{D5}$ and its analog output is $A_{D5}$.

The main DAC's transfer function is field and real-time programmable through an array of current mode DACs (iDAC). The main DAC's resistor string, is field programmable or real-time programmable by data bits $T_{D5i}$ (i-bit wide) and address bits $T_{D5j}$ (j-bit wide). The $T_{D5i}$ data bits are inputted to an array of iDACs, namely $F_{5A}$, $F_{5B}$, and $F_{5C}$, where each of the respective iDAC is selected by the address bits $T_{D5j}$.

The left-had side of the resistor string in FIG. 5 is a block diagram illustration of the method to provide field programmable or real-time programming of the resistor-string (main) DAC's transfer function. By sinking or sourcing programmable currents via iDACs into each of the selected voltage taps along the main DAC's resistor string reference network, the main DAC's transfer function can be re-programmed. As noted, the sinking and sourcing programmable current sourcing is accomplished by $F_{5A}$, $F_{5B}$, and $F_{5C}$ which are simplified block diagrams of the iDACs. Data bits and address bits for each of the iDACs $F_{5A}$, $F_{5B}$, and $F_{5C}$ are provided by the digital words $i_1$, $i_2$ and $i_3$, respectively. For example, $F_{5A}$ is a simplified block diagram representing an iDAC comprising of a bank of $S_{5B}$ analog switches (that are digitally addressed and enabled by digital words $i_1$) which select the binary weighted current sources ($I_{5A}$ bank) and steers the $F_{5A}$'s output currents onto node $V_{5A}$ of the main DAC selected resistor string voltage tap. In this example as touched upon earlier, the digital words $i_1$ (comprising of both the address bits and data bits of each iDAC) is provided by the output of logic block $L_{5B}$. The logic block $L_{5B}$ inputs are data bits $TD_{5i}$ (that is i-bit wide) and address bits $TD_{5j}$ (that is j-bit wide). Note that the bank of binary weighted current sources in iDACs, for example in $F_{5A}$, is comprising of bi-directional current sources (connected to positive and negative bias voltages $+VB_5$ and $-VB_5$) that sink and source currents from and to the voltage tap nodes (e.g., $V_{5A}$) along the resistor string reference network. The extra circuitry associated with the field and real-time programmable iDACs, has the following benefit: It has greater flexibility to attain different non-linear transfer functions that are real-time or field programmable (e.g., logarithmic, square, or arbitrary function) for resistor-string based data-converter. As noted earlier, the main resistor string DAC of FIG. 5 illustrates only 2-bits (n=2) of resolution for the sake of descriptive clarity, but n can be more than 2 and the data-converter's resolution can practically be up to 16-bits wide. Similarly, for the number of programmable iDACs are shown (for n=2 bits) $2^{n-1}$ or 3 iDACs ($F_{5A}$, $F_{5B}$, and $F_{5C}$) shown here for clarity of illustration, whereas n can be greater than 2 (and less than 16) depending on cost-precision requirement of the applications.

The field or real-time programmable iDACs can be programmed to follow a non-linear transfer function such as logarithmic, square, or other arbitrary transfer functions. As noted earlier, for higher resolution non-linear data-converters that are cost effective, a sub-ranging data converter arrangement may be utilized. In such a sub-ranging data-converter, the non-linear MSB data-converter can be arranged similar to the circuit illustrated in FIG. 5, and the LSB data converter can be arranged as a linear binary weighted DAC. In such arrangement, the LSB data-converter, extrapolates linearly between the non-linear ranges or windows (e.g., the range or window between $V_{5A}$ and $V_{5B}$) that are provided by the non-linear MSB data-converter, which in the case of FIG. 5 type topology would be a resistor-string main DAC. Setting aside the manufacturing non-idealities, the described transfer function here would follow an approximate non-linear transfer function where the precision of the overall data-converter is dominated by the non-linear transfer function of the MSB data-converter, and the approximation is due to the linear interpolation of the LSB data-converter.

Section 6—Description of FIG. 6

FIG. 6 is a simplified circuit schematic diagram illustrating embodiment of an ADC with field programmable or real-time programmable transfer function network. To the right of the resistor string in FIG. 6, there is the main ADC that is similar to the ADC illustrated in FIG. 2 which is described in section 2. In FIG. 6, the main ADC's analog input signal is $P_{A6}$ and its digital output signal word is $P_{D6}$ which is a n-bit wide digital word. Also, in FIG. 6, there is the field programmable or real-time programmable iDAC array that is to the left of the resistor string, and the iDAC array is similar to the one illustrated in FIG. 5 (to the left of FIG. 5's resistor-string) that is described in section 5. For the iDAC array section, the data bits are $TD_{6i}$ (i-bit wide) and the address bits are $TD_{6j}$ (j-bit wide). The iDAC array's analog outputs are coupled with their respective resistor-string voltage taps (e.g., $V_{6A}$, $V_{6B}$, and $V_{6C}$) which program the transfer function of the main ADC.

For more cost effective and higher resolution non-linear ADCs, a 2-step or sub-ranging ADC can be arranged, similar in principle to that described regarding the sub-ranging DACs in section 5. As noted earlier, in a sub-ranging data-converter, a first non-linear ADC digitizes the MSBs portion of the analog input (i.e., non-linear MSB ADC) and a second ADC linearly digitizes the LSB portions of the analog input. The transfer function of the non-linear MSB ADC can be field programmed or real-time programmed to follow a non-linear transfer function such as logarithmic, square, or arbitrary function. The linear LSB ADC can be a linear binary ADC, which in effect interpolates between the non-linear ranges of the MSB ADC. As such, a field programmable or real-time programmable ADC can be arranged that follows an approximate non-linear (e.g., logarithmic, square) transfer function.

Figure 7:
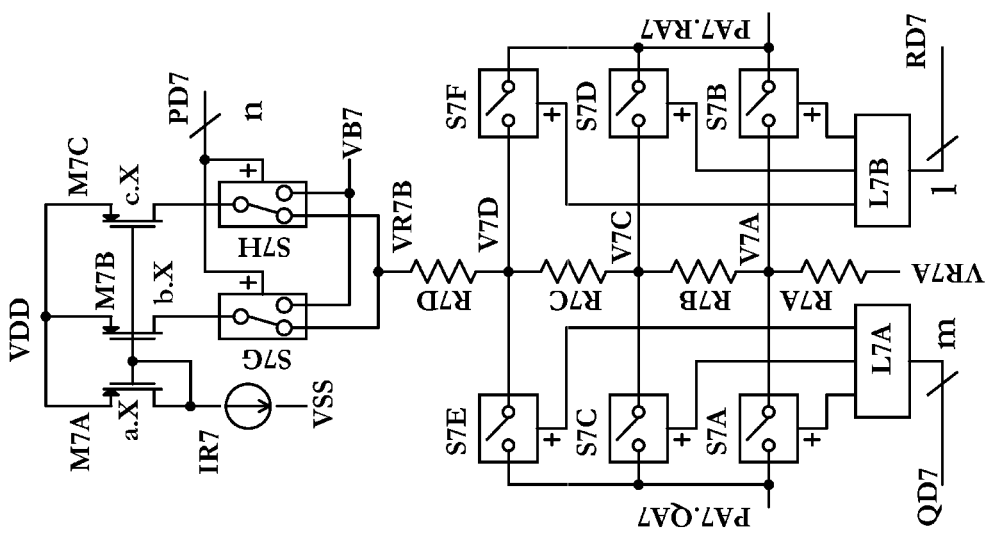
FIG. 7 is a simplified schematic diagram illustrating embodiment of plurality of mixed-mode digital-inputs to analog-voltage-output multipliers ($XD_iV_os$) comprising of a current-output DAC (iDAC) whose output supplies the reference input of a resistor-string that is shared between plurality of voltage-output DACs (vDAC).

Section 7—Description of FIG. 7

FIG. 7 is a simplified schematic diagram illustrating plurality of mixed-mode digital-inputs to analog-voltage-output multipliers ($XD_iV_os$) comprising of a current-output DAC (iDAC) whose output supplies the reference input of a resistor-string shared by plurality of voltage-output DACs (vDAC). Similar to previous sections and for illustrative clarity, here, the resolution of data-converters is shown as having two bits (e.g., 1=m=n=2), but 1, m and n can be up to 16-bits. Moreover, the plurality of vDAC channels or $Z_7$ channels is shown for $Z_7$=2 channels for illustrative clarity in FIG. 7 but $Z_7$ can be greater than 2. As noted earlier, in artificial neural networks or machine learning application, multi-channel (or matrix) multiplication is needed, where one signal needs to be multiplied cost effectively with plurality of signals at low power, small size, and with proper accuracy, which is one of the objectives of the embodiment disclosed in FIG. 7.

The P-channel iDAC's digital-inputs are $P_D$, and its reference input current is $IR_7$. The iDAC's output current flows out of node $VR_{7B}$ onto a resistor string that is shared amongst $Z_7$ plurality of vDACs. In the P-channel iDAC section for FIG. 7, the $IR_7$ is mirrored through $M_{7A}$ onto $M_{7B}$ and $M_{7C}$ which are binary weighted (e.g., b=1, c=2). The iDAC's $P_D$, that is n-bit wide, selects the respective iDAC switches (e.g., $S_{7G}$ and $S_{7H}$). The output of the iDAC' switches then sum the selected iDAC's binary weighted currents (e.g., $M_{7C}$ and $M_{7B}$) onto the iDAC output node at $VR_{7B}$. Accordingly, the binary weighted P-channel iDAC input-output equation can mathematically be expressed as $Io_p \approx IR_7 \times \Sigma_{D=1}^n P_D \times 2^{D-1}$, where $Io_p$ is the analog current output of the P-channel iDAC. Let's $\Sigma_{D=1}^n P_D \times 2^{D-1} = P_A$ where $P_A$ is equivalent analog-output signal representation of $P_D$ (which is the digital-input signal of the iDAC).

The $Z_7$ plurality of vDAC's section of FIG. 7 is similar to plurality of vDACs described in FIG. 3 of section 3.

The vDAC with $Q_D$ as its digital inputs (that are m-bit wide) is referred to as Q vDAC. The $VR_{7B}$ is the $VR_+$ reference input voltage. The $Q_D$ is the Q vDAC's digital input and it is 0 or 1 representing the value of the $D^{th}$ digital input bits of the Q vDAC. As noted earlier, a binary weighted vDAC equation can mathematically be expressed as $Vo_q \approx V_R \times \Sigma_{D=1}^m Q_D \times 2^{D-1}$, where $V_R = VR_{7B}$ and let's $\Sigma_{D=1}^m Q_D \times 2^{D-1} = Q_A$ where $Q_A$ is equivalent analog-output signal representation of $Q_D$, (which is the digital-input signal of the Q vDAC.)

Note that voltage $VR_{7B} \approx (Io_p \times R_7)$, where the sum of the resistance of the resistor string is $R_7 = R_{7A}$ $R_{7B}$ $R_{7C}$ $R_{7D}$ + . . . .

Therefore, the output for the Q vDAC, $Vo_{pq} \approx (Io_p \times R_7) \times \Sigma_{D=1}^m Q_D \times 2^{D-1}$. Accordingly, $Vo_{pq} \approx IR_7 \times R_7 \times \Sigma_{D=1}^n P_D \times 2^{D-1} \times \Sigma_{D=1}^m Q_D \times 2^{D-1}$. Thus, $(Vo_{pq}/R_7 \times IR_7) = P_A \times Q_A$.

Similar to the Q vDAC, the vDAC with $R_D$ as its digital inputs (that are 1-bit wide) is referred to as R vDAC. The $VR_{7B}$ is also the $VR_+$ reference input voltage. The $R_D$ is the R vDAC's digital input and it is 0 or 1 representing the value of the $D^{th}$ digital input bits of the R vDAC. Also, the binary weighted R vDAC equation can mathematically be expressed as $Vo_R \approx V_R \times \Sigma_{D=1}^l R_D \times 2^{D-1}$, where $V_R = VR_{7B}$ and let's $\Sigma_{D=1}^l R_D \times 2^{D-1} = R_A$ where $R_A$ is equivalent analog-output signal representation of $R_D$, (which is the digital-input signal of the R vDAC).

Similarly, the output for the R vDAC, $Vo_{pr} \approx (Io_p \times R_7) \times \Sigma_{D=1}^m Q_D \times 2^{D-1}$. Accordingly, $Vo_{pr} \approx IR_7 \times R_7 \times \Sigma_{i=1}^n P_D \times 2^{D-1} \times \Sigma_{D=1}^l R_D \times 2^{D-1}$. Thus, $(Vo_{pr}/R_7) \times (IR_7) = P_A \times R_A$.

In summary, $P_D$'s analog equivalent which is $P_A$ is multiplied by $Q_D$'s analog equivalent which is $Q_A$ as well as $R_D$'s analog equivalent which is $R_A$. As such, the resulting $P_A \times Q_A$ and $P_A \times R_A$ are generated using the same resistor string amongst 2-vDAC channels, namely the R and the Q DACs. As noted earlier, the same resistor string can be shared amongst $Z_7$ plurality of vDACs (more than 2 channels) which saves area, power, with improved matching between channels that share the same input-output transfer function (established by the shared resistor string).

In summary and in addition to the general benefits of this disclosure listed in the Background section, the benefits of the embodiment illustrated in the simplified FIG. 7 are (1) plurality of vDACs can share the same resistor string and tap into the same resistor string's voltage segments. As such, the $P_A$ that is generated from the iDAC can be then multiplied with plurality of signals. This would be a useful feature for machine learning or artificial neural networks that require matrix multiplication where one column signal such as one $P_A$ is multiplied with multiple rows of signals such as $Q_A$, $R_A$, and more. As noted earlier, besides saving chip area and lowering power consumption for sharing the same resistor-string, the matching between the plurality of vDACs that share the same resistor string is improved. (2) mixed-mode multiplication is arranged such that a multiplier $XD_iV_o$ accepts digital inputs and generates a voltage output, (3) the $XD_iV_o$ is fabricated in standard CMOS where the resistor string, that facilitates the voltage output generations, can be made of existing polysilicon on digital CMOS process, (4) the dynamic response of the multiplier is enhanced since the iDAC operates in current mode which is inherently fast, and the vDAC speed is dominated by a RC time constant at nodes $VR_{7B}$ and at the output of the multiplier that generates the $P_A \times Q_A$, (5) the non-trimmed precision of the multiplier would be dominated by the matching of iDAC current mirrors such as for example $M_{7B}$ and $M_{7C}$ and the matching of resistors in the resistor string of vDAC. (6) utilizing lower resolution data-converters, that occupy smaller areas, but have higher accuracy due to higher matching between binary weighted current sources or segmented current sources can be utilized in the data-converters, which would yield higher accuracy for the $P_A \times Q_A$ multiplication results at lower chip cost.

Note that it would be obvious to one skilled in the art to improve the precision of iDAC by, for example, utilizing current source segmentation, cascading reference current mirrors, and or boot-strapping the current reference to track the voltage $VR_{7B}$ Also, as noted before, it would be obvious to one skilled in the art, to increase the resolution of the DACs utilizing sub-ranging methods, or to save chip area in the vDAC's resistor string's switch decoding section, by for example, cascading in layers of switches instead of parallel taping the full $2^{m-1}$ logic decoded switches onto the resistor string network (e.g., $S_{7A}$, $S_{SB}$, $S_{7C}$, etc.).

Figure 8:
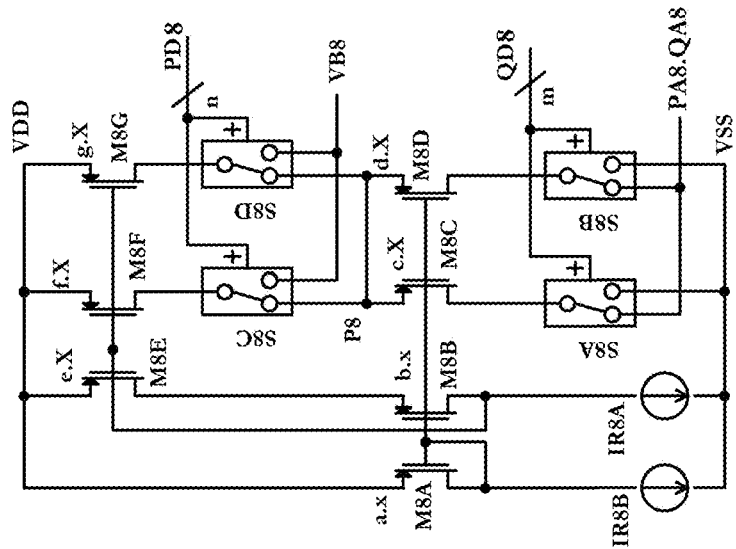
FIG. 8 is a simplified schematic diagram illustrating an embodiment of mixed-mode digital-inputs to analog-current-output multiplier ($XD_iI_o$) that operate in current mode comprising of a first current-output DAC (iDAC) whose output supplies the reference input to a second current-output iDAC.

Section 8—Description of FIG. 8

FIG. 8 is a simplified schematic diagram illustrating a mixed-mode digital-inputs to analog-current-output multiplier ($XD_iI_o$) that operates in current-mode comprising of a first current-output DAC (iDAC) whose output supplies the reference input to a second current-output iDAC.

Similar to the iDAC description provided in section 7, the first iDAC in FIG. 8 illustrates digital-inputs $P_D$ (that is n-bit wide), and reference input current is $IR_{8A}$ as well as a bias current $IR_{8B}$. One of the beneficial features of this disclosure is the arrangement of the coupling the first iDAC's output current terminal with the analog reference input terminal of the second iDAC at node $P_8$, which is described next.

In the first iDAC, the $IR_8$ is mirrored through iDAC's current sources (e.g., $M_{8E}$ onto $M_{8F}$ and $M_{8G}$) which are binary weighted (e.g., f=1, g=2). The iDAC's $P_D$, that is n-bit wide, selects the first iDAC switches (e.g., $S_{8C}$ and $S_{8D}$) that sum the respectively $M_{8F}$ and $M_{8G}$ iDAC output node selected iDAC's binary weighted currents (e.g., onto the at $P_8$. The second iDAC's reference input current is supplied by the first iDAC current output at node $P_8$, which concurrently supplies the second iDAC's binary weighted current sources (e.g., $M_{8C}$ and $M_{8D}$ where c=1 and d=2). The respectively selected second iDAC binary weighted current sources are summed at the second iDAC's output ($P_A \times Q_A$) after being selected by the second iDAC switches (e.g., $S_{8A}$ and $S_{8B}$). The ratio of $IR_{8A}$ and $IR_{8B}$ currents as well as the ratio W/Ls of $M_{8A}$ and $M_{8B}$ (e.g., the a, b ratios) establishes the $VGS_{M8A}$ that provides sufficient drain-to-source voltage (VDS) head-room for the first iDAC current sources (e.g., $M_{8F}$ and $M_{8G}$) as well as enough gate-to-source voltage (VGS) for the second iDAC current sources ($M_{8C}$ and $M_{8D}$). Moreover, setting aside normal manufacturing related device mismatches, the disclosed arrangement in FIG. 8 helps VDS of the first iDAC current sources to match to a first order (e.g., matched VDS between $M_{8E}$, $M_{8F}$ and $M_{8G}$). Also, in the disclosed arrangement in FIG. 8, the first iDAC's switch terminal voltages can be programmed by $VB_{8C}$ to track the voltage at $P_8$, which lowers glitches and improves the iDAC's switches (e.g., $S_{8A}$ and $S_{8B}$) dynamic response In addition to the general benefits of this disclosure listed in the Background section, the benefits of the embodiment illustrated in the simplified FIG. 8 are: (1) routing the first iDAC analog output current signal $P_A$ to the second iDAC's reference input terminal through a hand-off current mirror would burden the $XD_iI_o$ with its mismatches, delay, and extra size. This is due to the sizing requirement of the hand-off current mirror with respect to the second iDAC's binary weighted current sources. The disclosed arrangement of circuit illustrated in FIG. 8 avoids the hand-off current mirror and its burdens, by providing the first iDAC's analog output current directly onto the second iDAC's reference input terminal, (2) the $XD_i$ $I_o$'s signal processing is all in current mode and or via digital switching (i.e., fast logic). Steering signals in current mode swings with smaller voltage, which makes current mode signal processing fast, enables $XD_iI_o$ to run fast, (3) small voltage swings in current mode signal processing enables low power supply operations which enables $XD_iI_o$ to operate with low power supply voltages, (d) there are no passive devices in the embodiment of FIG. 8, and as such there is no need for resistors or capacitors, which reduces manufacturing size and cost, (4) the precision of $XD_iI_o$ would depend on the matching of the first iDAC's current sources amongst themselves and the matching of the second iDAC's current sources amongst themselves, (5) utilizing lower resolution data-converters, that occupy smaller areas, but have higher accuracy due to higher matching between the binary weighted current sources or segmented current sources, would yield higher accuracy $P_A \times Q_A$ multiplication at lower cost.

As noted earlier, the disclosure in FIG. 8 is illustrated with two bits of resolution for descriptive clarity but the topology can provide higher resolutions data converters (more resolution for the $XD_iI_o$). The precision of the first and second iDACs by for example utilizing current source segmentation, or cascading the iDAC's current mirrors. Bias voltage of the second terminal of the first and second iDAC's switches can be connected to different bias voltages or VSS depending on cost-performance requirement (e.g., $VB_{8C}$ can be connect to VSS and the other terminal of $S_{8A}$ and $S_{8B}$ can be connected to another bias voltage other than VSS as shown in FIG. 8)

Figure 9:
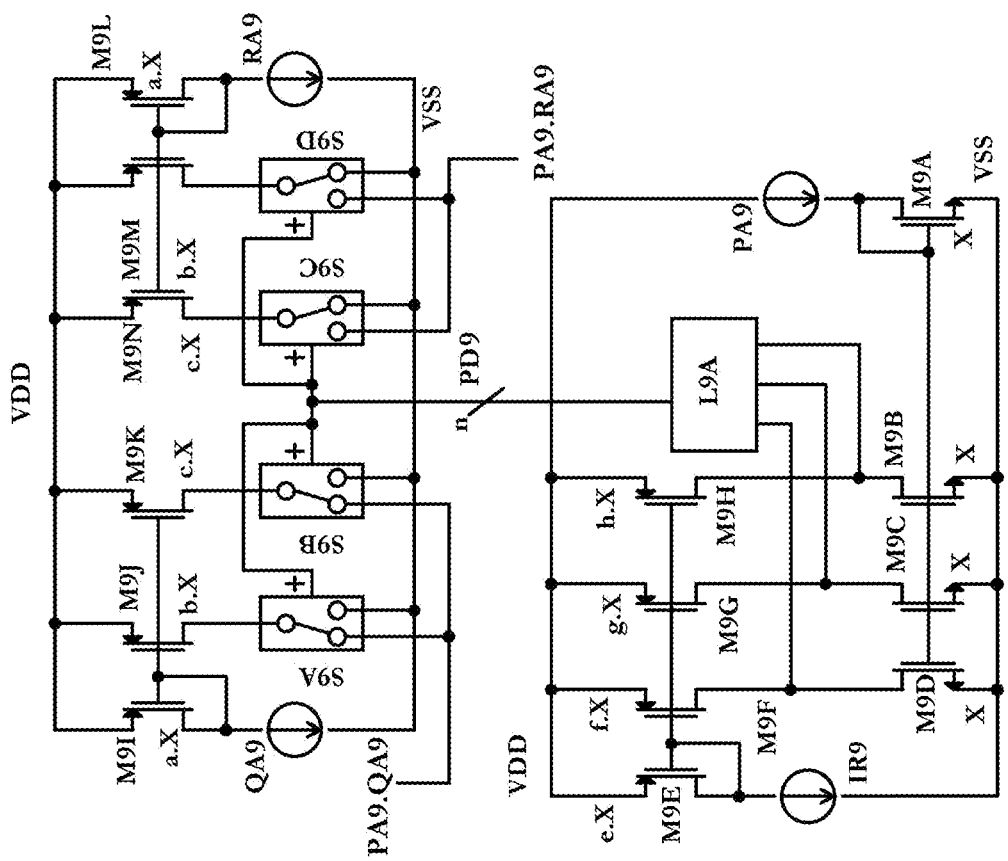
FIG. 9 is a simplified schematic diagram illustrating an embodiment of a matrix mixed-mode analog-current-inputs to analog-current-outputs multipliers ($XI_iI_os$) that operates in current mode comprising of a first current-output ADC (iDACs) whose digital output supplies the digital inputs of plurality of iDACs.

Section 9—Description of FIG. 9

FIG. 9 is a simplified schematic diagram illustrating a matrix mixed-mode vurrent analog-inputs to current analog-outputs multipliers ($XI_iI_os$) that operates in current mode comprising of a first current-output ADC (iDACs) digital output supplies the digital inputs of more than one iDACs. Accordingly, the matrix $XI_iI_os$ multiplies a single iADC analog-current input ($P_A$) by plurality of iDAC's analog-currents (e.g., $R_A$, $Q_A$, etc.) that are inputted to the reference terminal of plurality of iDACs (e.g., Q iDAC, R iDAC, etc). Similar to previous sections and for clarity of illustration, the data-converters resolution shown here are 2-bits, but resolution can be up to 16-bits, for example. Note also that for clarity of illustration, FIG. 9 shows only two iDAC's digital inputs receiving the iADC's digital-outputs, but the disclosure is applicable to plurality of (more than two) iDACs receiving their digital input from the single iADC. This matrix multiplication feature is particularly useful in machine learning or artificial engineering applications.

In FIG. 9. an iADC's reference current, $IR_9$ is applied to $M_{9E}$ which is mirrored and scaled (in thermometer arrangement) onto $M_{9H}$, $M_{9G}$, $M_{9F}$. Also in FIG. 9, the iADC analog-current input ($P_A$) is mirrored by $M_{9A}$ onto $M_{9B}$, $M_{9G}$, $M_{9D}$ where the mirrored $P_A$ input current signal is compared by thermometer reference currents of $M_{9H}$, $M_{9G}$, $M_{9F}$ respectively (e.g., thermometer scaling f=1, g=2, h=3). The logic circuit $L_{9A}$ comprising of comparator and encoder functions that receives the resultant respective $2^{n-1}$ (e.g., For n=2 there are $2^{n-1}$=3) current analog input signal to current reference signal differences, and accordingly, the $L_{9A}$ outputs the iADC digital output word $P_D$ that is n-bit wide (e.g., n=2 bits). The digital output $P_D$ is the digital representation of $P_A$ that is inputted to plurality of iDACs (e.g., one iDAC with $R_A$ current analog signal and the other iDAC with $Q_A$ current analog signal supplying the analog reference signal to the respective iDACs). Note that other current mode iADC architectures, such as gray-code or algorithmic can be utilized here as well.

The iDACs in FIG. 9 are similar to the iDACs described in sections 7 and 8. Let $Z_9$ be the plurality number of iDACs (e.g., $Z_9$=2 in FIG. 9). The plurality of iDAC's inputs receive the $P_{D9}$ digital word (e.g., two bit wide for n=2), and the reference of each of the plurality of iDACs (e.g., for $Z_9$=2 where one iDAC is the R iDACs and the other is the Q iDAC) are inputted with plurality of analog inputs (e.g., two inputs $R_A$ and $Q_A$ supplying the reference signal to R iDAC and Q iDAC, respectively). The analog outputs of the plurality of iDACs generate $Q_{A9} \times P_{A9}$ and $R_{A9} \times P_{A9}$, respectively. (e.g., for $Z_9$=2 the multiplication matrix has $Z_9$=2 rows and 1 column, where the $Z_9$ row entries are $Q_{A9}$ and $R_{A9}$ and the one column entry is $P_{A9}$).

Note also that it would be obvious to one skilled in the art to improve accuracy of the data-converters by current source segmentation and or cascading the current mirror that arrange the reference network of the data-converters. Also note that it would be obvious to one in the art to utilize sub-ranging current-mode data-converters to increase the resolution of data-converters cost effectively.

In addition to the general benefits of this disclosure listed in the Background section, the benefits of the embodiment illustrated in the simplified FIG. 9 are: (1) the $XI_iI_o$'s signal processing is in current mode and or via digital switching (i.e., fast logic). Steering signals in current mode swings nodes with smaller voltage, which makes current mode signal processing fast, and hence enables $XI_iI_o$ to run fast, (3) small voltage swings in current mode signal processing enables low power supply operations which enables $XI_iI_o$ to operate with low power supply voltages, (d) there are no passive devices in the embodiment of FIG. 9, and as such there is no need for resistors or capacitors, which reduces die size and chip cost, (4) the precision of $XI_iI_o$ would depend on the matching of the data-converter's current sources amongst themselves. Moreover, utilizing lower resolution data-converters would occupy smaller areas, but such data-converters having higher accuracy due to their higher matching binary weighted current sources or segmented current sources, would yield higher accuracy $P_A \times Q_A$ multiplication at lower cost.

Figure 10:
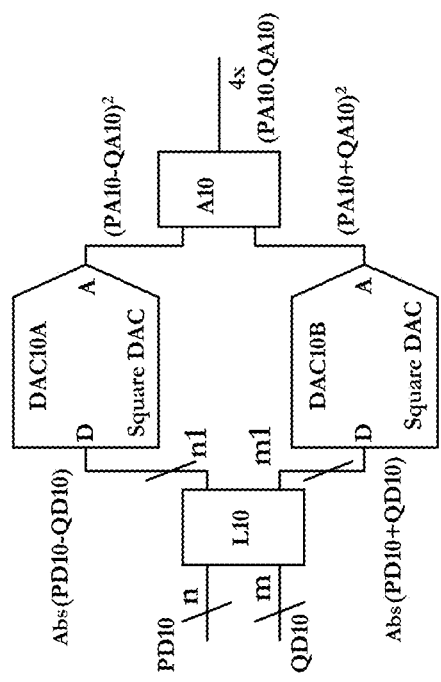
FIG. 10 is a simplified block diagram illustrating an embodiment of a digital-input to analog-output multiplier ($X_2D_iA_o$) utilizing plurality of DACs whose input-to-output transfer functions are programmed to approximates a square function.

Section 10—Description of FIG. 10

FIG. 10 is a simplified block diagram illustrating a digital-input to analog-output multiplier ($X_2D_iA_o$) utilizing two DACs whose input-to-output transfer functions are programmed to approximates a square function. The multiplication function illustrated in FIG. 10 is performed relying on the quarter square principle, which was described earlier in this disclosure.

In FIG. 10, a first digital input signal $P_{D10}$ (that is n-bit wide) and second digital input signal $Q_{D10}$ (that is m-bit wide) are applied to a logic circuit $L_{10}$ which generates a digital absolute value summation signals $|P_{D10}+Q_{D10}|$ (that is m1-bit wide) and a digital absolute value subtraction signal $|P_{D10}-Q_{D10}|$ (that is n1-bit wide). Then, $|P_{D10}+Q_{D10}|$ and $|P_{D10}-Q_{D10}|$ digital signals are applied to a first proximate square data-converter $DAC_{10B}$ and a second proximate square data-converter $DAC_{10A}$, respectively. In accordance with the proximate square transfer function profile of the first and second data-converters, $DAC_{10A}$ outputs the analog equivalent signal of $(|P_{A10}-Q_{A10}|)^2$ and $DAC_{10B}$ outputs the analog equivalent signal of $(|P_{A10}+Q_{A10}|)^2$. The analog circuit $A_{10}$ subtracts the analog outputs of $DAC_{10A}$ and $DAC_{10B}$ from one another and generates the analog representation of the two multiplied signals scaled by a factor of four or $4 \times P_{A10} \times Q_{A10}$ Note that the square of either a positive or a negative signal (e.g., $P_{D10}+Q_{D10}$ and $P_{D10}-Q_{D10}$) is a positive signal, which enables the disclosed multiplier in FIG. 10 to be capable of operating in four quadrants. Note also that implementation of logic circuit $L_{10}$'s functions of addition, subtraction, and absolute value simple and low cost in logic.

As noted earlier, a shared resistor string (that is programmed to approximate a square input-output transfer function) between $DAC_{10B}$ and $DAC_{10A}$ saves area, reduces power consumption, and improves matching.

In FIG. 10, implementing the square data-converters in current mode will have the following benefits: (1) operating in current mode is fast, (2) current voltage swings are smaller compared to voltage mode, which enables operating the multiplier with lower power supply voltage, (3) operating at low supply voltage reduces power consumption, (4) subtraction function performed in analog and current mode is small and fast. Also note that analog implementation of summation and subtraction of array of pairs of multiplied signals in $A_{10}$ circuit (e.g., to perform the multiply and accumulate function needed in artificial neural networks and machine learning applications) can be made simple, small, and fast. Moreover, operating in current mode in FIG. 10, the output of $A_{10}$ circuit would be a current signal of $4 \times P_{A10} \times Q_{A10}$ that can be fed onto a current mode ADC (iADC), to provide the conversion and scaling to a digital word representing $P_{D10} \times Q_{D10}$.

Additionally, note that besides resistor string or reference current network, other data-converter with square transfer functions can be utilized here such as a switch-capacitive data-converters whose capacitive transfer function network is programmed to approximates a square input-to-output transfer function. Furthermore, note that principles of FIG. 10 embodiment are applicable to multiple channel (array-based multiplication and accumulation) by utilizing the same two data-converters, in multiple cycles, while saving each multiplication result on array of sample-and-hold circuits the receive the output of the $A_{10}$, which are the multiplication results of array of pairs of inputs, as an example. Such arrangements would have the following benefits: (1) It saves on area and cost, (2) lower power consumption, (3) the conversions based on the same data-converters matched better, which can allow for one system-wide correction or trim to improve accuracy, such as correcting for gain error, offsets, or switch capacitor sample-and-hold droop rates. Naturally, the trade-off here is in utilizing the same two data-converters between an array of channels to be multiplied sequentially, would extend the conversion cycles which slows down the data processing time.

Figure 11:
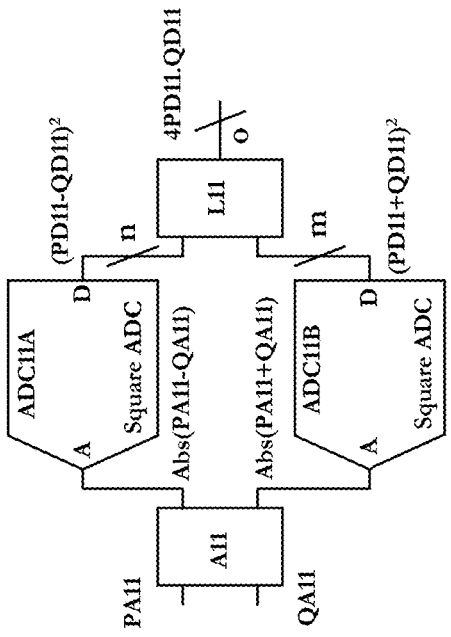
FIG. 11 is a simplified block diagram illustrating an embodiment of an analog-input to digital-output multiplier ($X_2A_iD_o$) utilizing plurality of ADCs whose input-to-output transfer functions are programmed to approximates a square function.

Section 11—Description of FIG. 11

FIG. 11 is a simplified block diagram illustrating an analog-input to digital-output multiplier ($X_2A_iD_o$) utilizing two ADCs whose input-to-output transfer functions are programmed to approximates a square function. The multiplication function in FIG. 11 is performed relying on the quarter square principle, which was described earlier in this disclosure.

In FIG. 11, an analog input signal $P_{A11}$ and second analog input $Q_{A11}$ are applied to an analog signal conditioning circuit $A_{11}$ which generates an analog absolute value summation signals $|P_{A11}+Q_{A11}|$ as well an analog absolute value subtraction signal $|P_{A11}-Q_{A11}|$. Then, $|P_{A11}+Q_{A11}|$ and $|P_{A11}-Q_{A11}|$ analog signals are applied to a first proximate square data-converter $ADC_{11B}$ and a second proximate square data-converter $ADC_{11A}$, respectively. In accordance with the proximate square transfer function of the first and second data-converters, $ADC_{11A}$ outputs the digital equivalent signal of $(|P_{D11}-Q_{D11}|)^2$ that is m-bit wide, and $ADC_{11B}$ outputs the digital equivalent signal of $(|P_{D11}+Q_{D11}|)^2$ that is n-bit wide. The digital circuit $D_{11}$ subtracts the analog outputs of $ADC_{11A}$ and $ADC_{11B}$ from one another and generates the digital representation of the two multiplied signals scaled by a factor of four or $4 \times P_{D10} \times Q_{D10}$ Note that the square of both positive or negative signals (e.g., $P_{A10}+Q_{A10}$ and $P_{A10}$ $Q_{A10}$) is a positive signal, which enables the disclosed multiplier to be capable of operating with four quadrants. As noted in section 4, a shared resistor string (that is programmed to approximate a square input-output transfer function) between $ADC_{11B}$ and $ADC_{11A}$ saves area, reduces power consumption, and improves matching.

Also, in FIG. 11, implementing the square data-converters in current mode will have the following benefits: (1) operating in current mode is fast, (2) current voltage swings are smaller compared to voltage mode, which enables operating the multiplier with lower power supply voltage, (3) operating at low supply voltage reduces power consumption, (4) implementing the addition, subtraction, and absolute value function implementations in analog current mode is small and fast. Also note that digital implementation of subtraction and divide by 4 in logic circuit $L_{11}$ can be made simple, small, and fast.

Furthermore, note that besides the alternatives of utilizing data-converters whose transfer function is based on resistor string or reference current network, a switched capacitor arrangement can also be utilized. For example, switch-capacitive data-converters whose capacitive transfer function is programmed to follow a square transfer function profile. Also note that a multiple-input to single-output sample-hold can sequentially supply the $X_2A_iD_o$ with pairs of analog signals to be multiplied and digitized sequentially, which is useful for neural artificial intelligence and machine learning application requiring matrix multiplication plus accumulation functions. The sequential outputs of a $X_2A_iD_o$ in such an arrangement can be subsequently added, divided by 4, and stored in memory for post signal processing, which is a simple implementation in logic. The sample and hold array-based arrangement that was just described has the following benefits: (1) saves on area and cost, (2) has lower power consumption, (3) all conversions matched better since the same $X_2A_iD_o$ performs the multiplication function and converts the multiplied array of pairs of signals. Additionally, such arrangement would enable one system-wide correction to improve accuracy, such as gain error, offsets, or systematic droop rates associated with the front-end analog sample-and-hold. Naturally, the trade-off here is in utilizing the same two data-converters between an array of channels to be multiplied sequentially, would extend the conversion cycles which slows down the data processing time.

As noted earlier, in the case of an array of independent $X_2A_iD_o$ that utilize independent ADCs with a single shared a square input-to-output transfer function reference network, there are savings on power, area, and enhanced matching between ADC channels and better matching between multiplication results. Naturally, another benefit is that all multiplication results would be available asynchronously without need to a clock or without cycle delay. Also, such an arrangement can allow for one system-wide correction or trim of the single shared reference network to improve accuracy, such as gain error or offset.

Section 12—Description of FIG. 10

Figure 12:
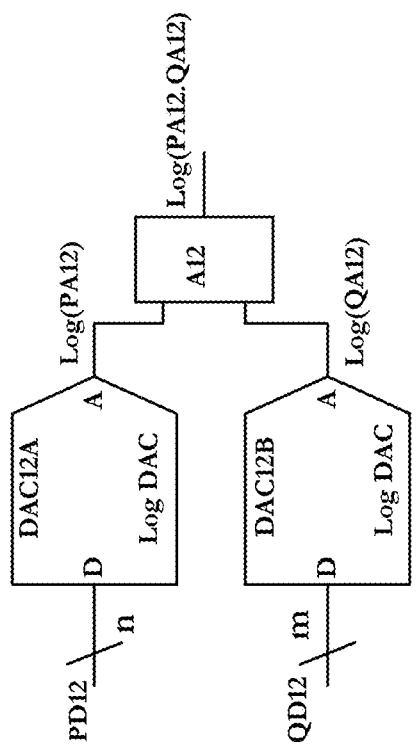
FIG. 12 is a simplified block diagram illustrating an embodiment of a digital-input to analog-output multiplier ($X_{log}D_iA_o$) utilizing plurality of DACs whose input-to-output transfer functions are programmed to approximates a logarithmic function.

FIG. 12 is a simplified block diagram illustrating a digital-input to analog-output multiplier ($X_{log}D_iA_o$) utilizing two DACs whose input-to-output transfer functions are programmed to approximates a logarithmic function. The multiplication function illustrated in FIG. 12 is performed relying on the quarter square principle, which was described earlier in this disclosure.

In FIG. 12, a first digital input $P_{D12}$ (that is n-bit wide) and second digital input $Q_{D12}$ (that is m-bit wide) are applied to a first proximate square data-converter $DAC_{12A}$ and a second proximate square data-converter $DAC_{12B}$, respectively. In accordance with the proximate logarithmic transfer function profile of the first and second data-converters, $DAC_{12A}$ outputs the analog equivalent signal of $\log(P_{A12})$ and $DAC_{12B}$ outputs the analog equivalent signal of $\log(Q_{A12})$. The analog circuit $A_{12}$ sums the analog outputs of $DAC_{12A}$ and $DAC_{12B}$ and generates the analog representation of the two multiplied signals in the logarithmic domain or $\log(P_{A12} \times Q_{A12})$. The summation function for voltage signals can be implemented with averaging function of two equal resistors (e.g., resistor divider) being supplied on each of the resistor's end with buffered voltage signals equivalent of $\log(P_{A12})$ and $\log(Q_{A12})$. The summation of analog current signals would be simple coupling of current signal equivalents of $\log(P_{A12})$ and $\log(Q_{A12})$.

As noted earlier, a shared resistor string (that is programmed to approximate a logarithmic input-output transfer function) in FIG. 12 between $DAC_{12B}$ and $DAC_{12A}$ saves area, reduces power consumption, and improves matching.

In FIG. 12, implementing logarithmic data-converters in current mode will have the following benefits: (1) operating in current mode is fast, (2) current voltage swings are smaller compared to voltage mode, which enables operating the multiplier with lower power supply voltage, (3) operating at low supply voltage reduces power consumption, (4) as noted earlier the summation function in current mode involves shorting the $\log(P_{A12})$ and $\log(Q_{m2})$ analog current signals and the dynamic response is inherently fast. Also, operating in current mode, the output current signal representing $\log(P_{A12} \times Q_{A12})$ can be fed onto an anti-log (exponential) current mode ADC (iADC), to provide the conversion to a digital word representing $P_{D12} \times Q_{D12}$.

In addition, note that besides resistor string or reference current network, other data-converter with logarithmic transfer functions can be utilized here such as a switch-capacitive data-converters whose capacitive transfer function network is programmed to approximates a logarithmic input-to-output transfer function. Moreover, note that principles of FIG. 12 embodiment are applicable to multiple channel (array-based multiplication and accumulation) by utilizing the same two data-converters, in multiple cycles, while saving each of log-based multiplication result sequentially on array of sample-and-hold circuits whose output feeds an anti-log iADC to remap the log based analog information to linear binary digital words. Such an arrangement would have the following benefits: (1) saves on die area and chip cost, (2) has lower power consumption, (3) the conversions based on the same data-converters matched better, which can allow for one system-wide correction or trim to improve accuracy, such as correcting for gain error, offsets, or switch capacitor sample-and-hold droop rates. Naturally, the trade-off here is in utilizing the same two data-converters between an array of channels to be multiplied sequentially, would extend the conversion cycles which slows down the data processing time.

Figure 13:
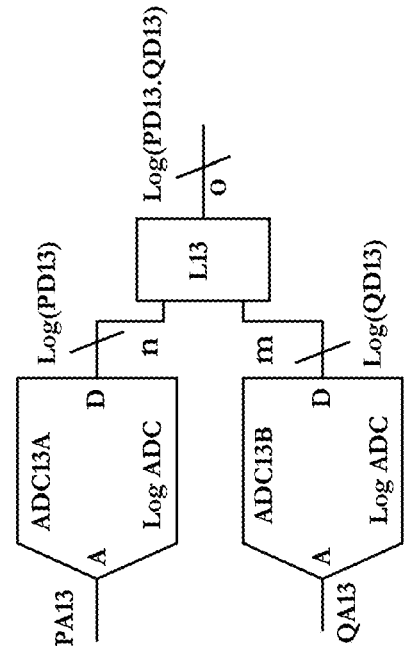
FIG. 13 is a simplified block diagram illustrating an embodiment of an analog-input to digital-output multiplier ($X_{log}A_iD_o$) utilizing plurality of ADCs whose input-to-output transfer functions are programmed to approximates a logarithmic function.

Section 13—Description of FIG. 13

FIG. 13 is a simplified block diagram illustrating an analog-input to digital-output multiplier ($X_{log}A_iD_o$) utilizing two ADCs whose input-to-output transfer functions are programmed to approximates a logarithmic function. The multiplication function in FIG. 13 is performed relying on logarithmic principle, which was described earlier in the disclosure.

In FIG. 13, a first digital input $P_{A13}$ and second digital input $Q_{A13}$ are applied to a first proximate logarithmic data-converter $ADC_{13A}$ and a second proximate logarithmic data-converter $ADC_{13B}$, respectively. In accordance with the proximate logarithmic transfer function profile of the first and second data-converters, $ADC_{13A}$ outputs the analog equivalent signal of $\log(P_{D13})$ and $ADC_{13B}$ outputs the analog equivalent signal of $\log(Q_{D13})$. The logic circuit $L_{10}$ sums the digital outputs of $ADC_{13A}$ and $ADC_{13B}$ and generates the analog representation of the two multiplied signals in the logarithmic domain or $\log(P_{D13} \times Q_{D13})$.

As noted in section 4, a shared resistor string (that is programmed to approximate a logarithmic input-output transfer function) in FIG. 13 between $ADC_{13A}$ and $ADC_{13B}$ saves area, reduces power consumption, and improves matching. Also, in FIG. 13, implementing the logarithmic data-converters in current mode will have the following benefits: (1) operating in current mode is fast, (2) current voltage swings are smaller compared to voltage mode, which enables operating the multiplier with lower power supply voltage, (3) operating at low supply voltage reduces power consumption, (4) implementing the addition of log $(P_{D13})$ and $\log(Q_{D13})$ in logic is small and fast.

Additionally, note that besides the alternatives of utilizing data-converters whose transfer function is based on resistor string or reference current network, a switched capacitor arrangement can also be utilized. For example, switch-capacitive data-converters whose capacitive transfer function is programmed to follow a logarithmic transfer function profile. Also note that a multiple-input to single-output sample-hold can sequentially supply the $X_{log}A_iD_o$ with pairs of analog signals to be multiplied and digitized sequentially, which is useful for neural artificial intelligence and matching learning application requiring matrix multiplication plus accumulation functions. The sequential outputs of a $X_{log}A_iD_o$ in such an arrangement can be subsequently added, and stored in logic for conversion to linear binary, which is a simple implementation in the digital domain. The sample and hold array-based arrangement that was just described has the following benefits: (1) saves on area and cost, (2) has lower power consumption, (3) all conversions matched better since the same $X_{log}A_iD_o$ performs the multiplication function and converts the multiplied array of pairs of signals. Also, such arrangement would enable one system-wide correction to improve accuracy, such as gain error, offsets, or systematic droop rates associated with the front-end analog sample-and-hold. Naturally, the trade-off here is in utilizing the same two data-converters between an array of channels to be multiplied sequentially, would extend the conversion cycles which slows down the data processing time.

As noted earlier, in the case of an array of independent $X_{log}A_iD_o$ that utilize independent ADCs with a single shared a logarithmic input-to-output transfer function reference network, there are saving on power, area, and enhanced matching between ADC channels and better matching between multiplication results. Naturally, another benefit is that all multiplication results would be available asynchronously without need to a clock or without cycle delay. Also, such an arrangement can allow for one system-wide correction or trim of the single shared reference network to improve accuracy, such as gain error or offset.

Figure 14:
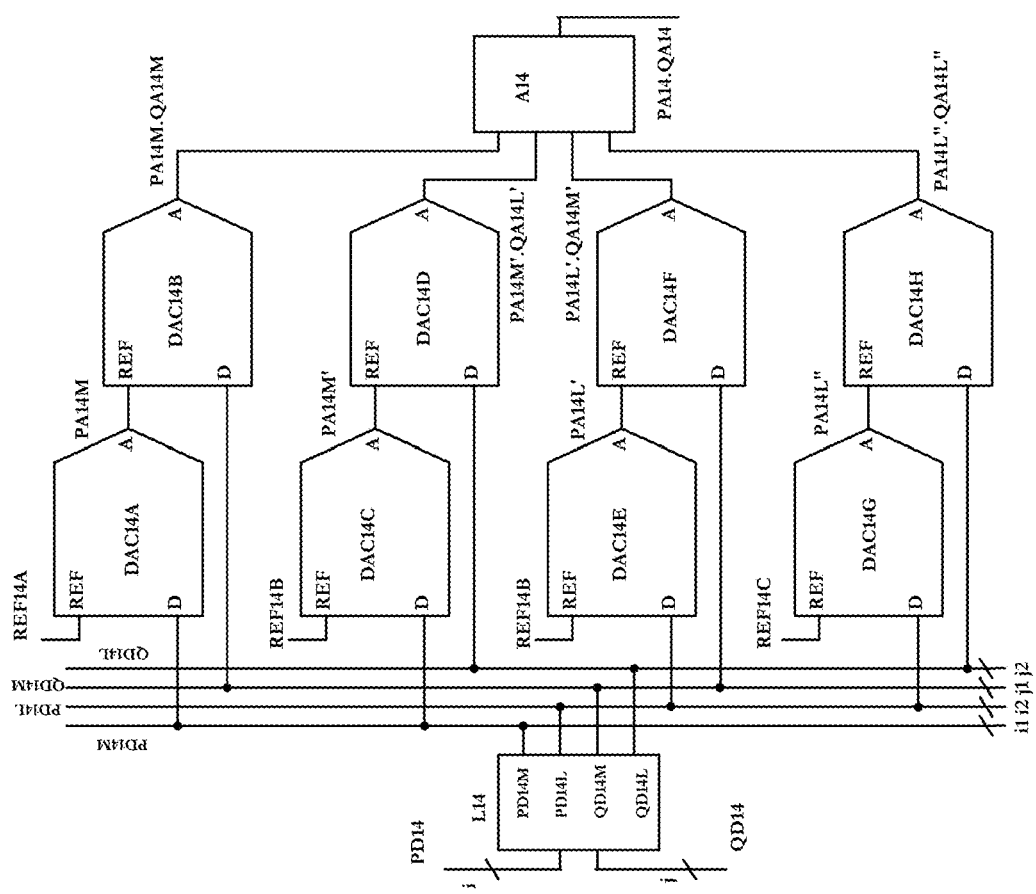
FIG. 14 is a simplified functional block diagram illustrating an embodiment of a digital-input to analog-output multiplier ($X_SD_iA_o$) utilizing segmented mixed-mode multiplication ($SM^3$) method.

Section 14—Description of FIG. 14

FIG. 14 is system block diagram illustrating a digital-input to analog-output multiplier ($X_SD_iA_o$) utilizing segmented mixed-mode multiplication ($SM^3$) method. The $SM^3$ method performs the multiplication function by utilizing mixed-mode and data-converter circuits arranged based on the multiplication principle of segmentation which is described as follows:

The input signals P and Q are partitioned to most significant portions (MSP) and Least-Significant-Portions (LSP). In describing the method $SM^3$, P is equal to the sum of MSP of P plus LSP of P, and similarly, Q is equal to the sum of MSP of Q plus LSP of Q. Also, in describing the $SM^3$ method, the MSP and LSP signals can be analog or digital or combination representations of their respective P and Q signals.

First the most significant portion of the input signals' multiplication is generated. Here, a P's MSP ($P_{MSP}$) is multiplied by a Q's MSP ($Q_{MSP}$) utilizing at least one data-converter to generate a scaled (S) segment of multiplication $S \times P_{MSP} \times Q_{MPS}$.

Then, the cross-multiplication or the intermediate segment of the multiplication is generated utilizing at least one data-converter. Here, a P's LSP ($P_{LSP}$) is multiplied with the $Q_{MSP}$, to generate another scaled (S') segment of multiplication $S' \times P_{LSP} \times Q_{MSP}$ Similarly, a Q's LSP ($Q_{LSP}$) is multiplied with the $P_{MSP}$, to generate another scaled (S') segment of multiplication $S' \times Q_{LSP} \times P_{MSP}$.

Lastly, the least significant portion of the multiplication is generated utilizing at least one data-converter. Here, another scaled (S") segment of multiplication $S'' \times P_{LSP} \times Q_{LSP}$ is generated.

Finally, the multiplication results of P×Q is generated by summing each above segment that each carries their proportional scale factors:

$$P \times Q = S \times P_{MSP} \times Q_{MSP} + S' \times (P_{LSP} \times Q_{MSP} + Q_{LSP} \times P_{MSP})$$
$$S'' \times P_{LSP} \times Q_{LSP}$$

The benefits of utilizing $SM^3$ method to multiply signals are as flows:

First, the accuracy of the multiplication is dominated by the $P_{MSP} \times Q_{MSP}$ which allows utilizing less accurate and lower cost data-converters to perform the intermediate segments cross multiplication or ($P_{MSP} \times Q_{LSP}$ $Q_{MSP} \times P_{LSP}$) and even less accurate and smaller data-converters to perform the LSP multiplication of $P_{LSP} \times Q_{LSP}$. This benefit enables making the data converters utilized in the intermediate and least significant portions of multiplication smaller which saves on die area and chip cost.

Second, utilizing the disclosed method where data-converters perform multiplication, then low-resolution data-converter whose transfer function has higher-accuracy can be utilized, which would generate multiplication results with higher-accuracy, and this is how. For example, considering normal manufacturing related imperfections, if the transfer function of a 4-bit resolution data-converter can be linear to 8-bits or 0.4% accuracy, then utilizing a data-converters with 4-bits of resolution (to perform the multiplication in accordance with the disclosed method), then the generated multiplication results would be accurate to 8 bits of 0.4%. As such, high-accuracy multiplication can be achieved with less resolution and thus smaller size data-converters, which lowers the die cost of the multiplier.

Third, the dynamic response of the multiplier is improved since the speed would be mainly a function of the dynamic response of the most significant portion of the input signals' multiplication or speed of $P_{MPS} \times Q_{MSP}$, and as such the multiplication speed in the intermediate and least significaction is less critical.

Fourth, segmenting the multiplication process allows the data-converter's transfer function reference network be arranged in smaller segments which in turn improves the glitch transients associated with data-converter's code transition.

Fifth, there is an area trade-off between performing multiplication using conventional multiplying DACs versus the disclosed segmented multiplication. For multiplication using high-resolution data-converters, the large size of the transfer function reference network associated with a high-resolution data converter is replaced with plurality of smaller transfer function reference network segments associated with lower resolution data-converters.

Here, FIG. 14 which is an embodiment of the disclosed $SM^3$ method is described. In FIG. 14, the two digital-input words to be multiplied are $P_{D14}$ (that is i-bit wide and as an example i=6) and $Q_{D14}$ (that is j-bit wide and as an example j=6). A logic circuit $L_{14}$ provides $P_{D14M}$ (that is it-bit wide and as an example i1=3) which is the Most-Significant-Portion (MSP) of $P_{D14}$. The logic circuit $L_{14}$ also provides $P_{D14L}$ (that is i2-bit wide and as an example i2=3) which is the Least-Significant-Portion (LSP) of $P_{D14}$. Also, $L_{14}$ provides $Q_{D14M}$ (that is j1-bit wide and as an example j1=3) which is the MSP of $Q_{D14}$ and $L_{14}$ also provides $Q_{D14L}$ (that is j2-bit wide and as an example j2=3) which is the LSP of $Q_{D14}$.

At this point, the MSP segments multiplication is described. In FIG. 14, the reference input of a $DAC_{14A}$ receives a reference signal $REF_{14A}$. The digital-input port of $DAC_{14A}$ receives the digital input word $P_{D14M}$, and the $DAC_{14A}$ generates an analog signal $P_{A14M}$ at its analog-output port. The reference input of a $DAC_{14B}$ receives the analog reference signal $P_{A14M}$. The $DAC_{14B}$ receive the digital-input word $Q_{D14M}$ and the $DAC_{14B}$ generates an analog signal $P_{A14M} \times Q_{A14M}$ at its analog-output port.

Now, the MSP and LSP segments cross multiplication is described. Also, in FIG. 14, the reference input of a $DAC_{14C}$ receives a reference signal $REF_{14B}$. The digital-input port of $DAC_{14C}$ receive the digital input word $P_{A14M'}$ and the $DAC_{14C}$ generates an analog signal $P_{A14M'}$ at its analog-output port. The reference input of a $DAC_{14D}$ receives the analog reference signal $P_{A14M''}$. The $DAC_{14D}$ receives the digital-input word $Q_{D14L}$ and the $DAC_{14D}$ generates an analog signal $P_{D14L} \times Q_{A14L'}$ at its analog-output port. Also, the reference input of a $DAC_{14E}$ receives a reference signal $REF_{14B}$. The digital-input port of $DAC_{14E}$ receive the digital input word $P_{D14L'}$ and the $DAC_{14E}$ generates an analog signal $P_{A14L'}$ at its analog-output port. The reference input of a $DAC_{14F}$ receives the analog reference signal $P_{A14L''}$. The $DAC_{14F}$ receives the digital-input word $Q_{D14M}$ and the $DAC_{14F}$ generates an analog signal $P_{A14L} \times Q_{A14M'}$ at its analog-output port.

Here, the LSP segments multiplication is described. In FIG. 14, the reference input of a $DAC_{14G}$ receives a reference signal $REF_{14C}$. The digital-input port of $DAC_{14G}$ receive the digital input word $P_{D14L'}$ and the $DAC_{14G}$ generates an analog signal $P_{A14L''}$ at its analog-output port. The reference input of a $DAC_{14H}$ receives the analog reference signal $P_{A14L''}$. The $DAC_{14H}$ receive the digital-input word $Q_{D14L}$ and the $DAC_{14H}$ generates an analog signal $P_{A14L} \times Q_{A14L''}$ at its analog-output port.

Note that the reference signal values of $REF_{14A}$ is scaled at S, $REF_{14B}$ is scaled at S', and $REF_{14C}$ is scaled at S''. For example, having 6-bit DACs where i=j=6, and where i1=j1=3, and i2=j2=3, then for S=1, $S'=S/2^{i1}=S/2^3=S/8$ and $S''=S'/2^{j1}=S'/2^3=S'/8=S/(8\times8)$. In this example, the full-scale value at the analog output of $DAC_{14B}$ would be 8 times bigger than full-scale value at the analog output of $DAC_{14D}$ and $DAC_{14F}$. Also, the full-scale value at the analog output of $DAC_{14B}$ would be 8×8=64 times bigger than full-scale value at the analog output of $DAC_{14H}$. Moreover, in this example, the signal value of $REF_{14A}$ could be 8 times bigger than the signal value of $REF_{14B}$. Also, the signal value of $REF_{14A}$ could be 8×8=64 times bigger than the signal value of $REF_{14C}$.

As noted earlier, the summation function in current mode is simple, and eliminates the need for an analog circuit $A_{14}$. After proportional scaling of each segment multiplication as explained above, current mode summation is realized by coupling each of the multiplying segment iDAC outputs together (i.e., summing the current output of iDACs including $DAC_{14B}$, $DAC_{14D}$, $DAC_{14F}$, and $DAC_{14H}$). Thus, $P_{A14} \times Q_{A14}$ analog current multiplications is generated by scaling the sum of the segments multiplication of the multiplier's input signal's most-significant and least-significant portions that is $P_{A14M} \times Q_{A14M} + P_{A14M} \times Q_{A14L} + P_{A14L} \times Q_{A14M} + P_{A14L''} \times Q_{A14L''}$.

An alternative embodiment of $XD_iA_o$, as a variation to the disclosure illustrated in FIG. 14, would be to use a digital multiplier to perform the most-significant-portion of segment multiplication in logic and then apply the digital multiplication result to a DAC. In other words, the digital MSP portions of the digital-input words or $P_{D14M}$ and $Q_{D14M}$ are applied to a digital multiplier which generates the most significant portion of digital-input multiplication results in digital form of $P_{D14M} \times Q_{D14M}$. Then, $P_{D14M} \times Q_{D14M}$ digital signal is inputted to a DAC to generate an analog equivalent form of $P_{A14M} \times Q_{A14M}$. Since the digital multiplication would result with no error, the DAC accuracy will dominate the accuracy of the analog equivalent form of $P_{A14M} \times Q_{A14M'}$ which dominates the accuracy of this alternative embodiment of $XD_iA_o$. As such, if high precision is required, the DAC can be made more accurate by improving its transfer function reference network accuracy by means such as segmentation, calibration, or trimming and other ways. For the alternative embodiment of $XD_iA_o$ that was just disclosed, but for the alternative arrangement to generate $P_{A14M} \times Q_{A14M'}$ the rest of the arrangement can remain as illustrated in FIG. 14.

To save die area and chip cost, another alternative embodiment of $XD_iA_o$ which would be a variation to the disclosure illustrated in FIG. 14 would be to utilize one DAC (instead of $DAC_{14A}$ and $DAC_{14B}$) to generate the $P_{A14M}$ signal and then scale it down by factor of S to S' to generate the $P_{A14M'}$ signal. Similarly, one DAC (instead of $DAC_{14E}$ and $DAC_{14G}$) to generate the $P_{A14L}$ signal and then scale it down by factor of S' to S'' to generate the $P_{A14L''}$ signal.

A current mode embodiment of $XD_iA_o$ disclosed in FIG. 14 (which would be designated as a $XD_iI_o$) could be arranged as a current-mode multiplier that utilizes current-mode DACs (iDACs) to perform segment multiplication (i.e., segment multiplying iDACs) as disclosed in the section 8 illustration of FIG. 8. For example, digital-inputs to analog-current-output multiplier $XD_iI_o$ of FIG. 8 (naturally, considering the resolution of the segment multiplying iDAC's as needed by the application and proportional S, S', and S' scaling of current reference $IR_{8A}$) can be utilized to perform the function of segment multiplication by pairs of segment multiplying iDACs including $DAC_{14A}$–$DAC_{14B}$, $DAC_{14C}$–$DAC_{14D}$, $DAC_{14E}$–$DAC_{14F}$, and $DAC_{14G}$–$DAC_{14H}$. As noted earlier, the current reference network of the most-significant-portion of the segment multiplying iDACs (i.e., $DAC_{14A}$–$DAC_{14B}$) can be made more accurate by current network segmentation, trimming, calibration, or selecting larger W/L field-effect-transistors or FETs (e.g., the most-significant portion multiplying iDACs having larger W/L for $M_{8F}$, $M_{8G}$, and etc.). Also, to save die area and lower chip cost, the intermediate to LSP segment multiplying iDACs can, for example, be designed as having less accurate and smaller FETs.

It would be obvious to one skilled in the art to convert the analog multiplication results $P_{A14} \times Q_{A14}$ and convert to digital utilizing a voltage mode or current mdoe ADC to generate the digital representation of the multiplication results $P_{D14} \times Q_{D14}$.

Figure 15:
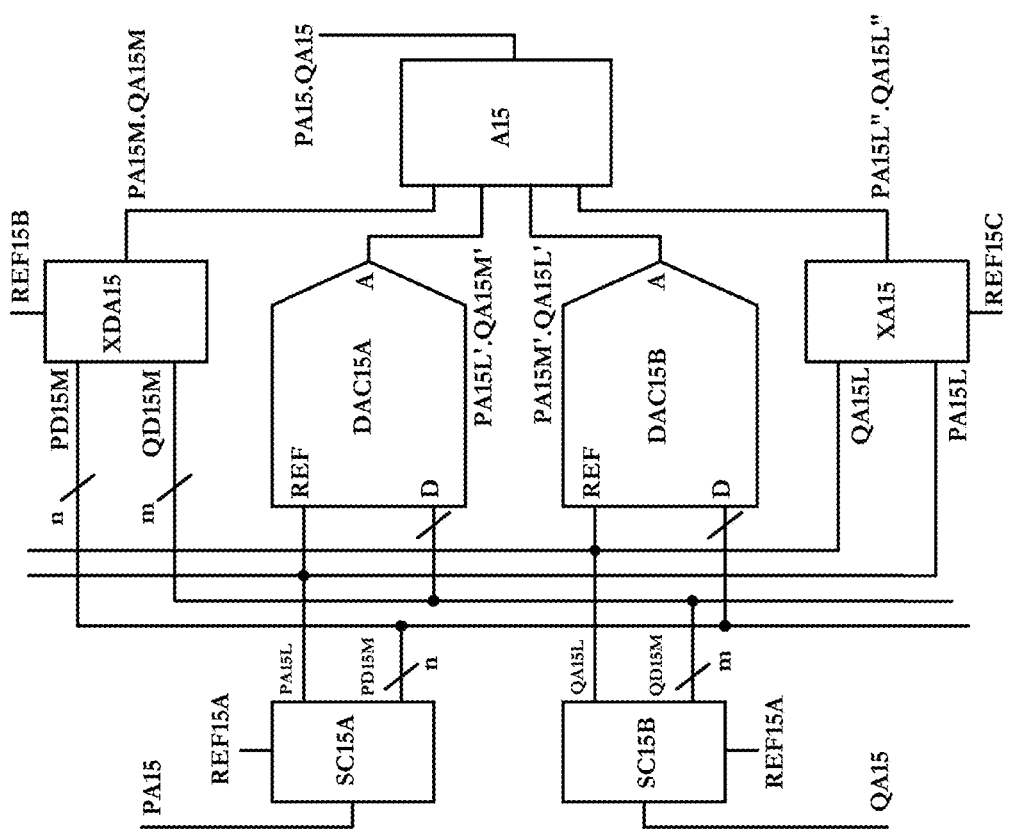
FIG. 15 is a simplified functional block diagram illustrating an embodiment of an analog-input to analog-output multiplier ($X_SA_iA_o$) utilizing segmented mixed-mode multiplication ($SM^3$) method.

Section 15—Description of FIG. 15

FIG. 15 is a simplified system block diagram illustrating an analog-input to analog-output multiplier $(X_SA_iA_o)$ utilizing segmented mixed-mode multiplication ($SM^3$) method.

In FIG. 15, the two analog-inputs of $X_SA_iA_o$ are $P_{A15}$ and $Q_{A15}$, which are inputted to signal conditioning (SC) $SC_{15A}$ and $SC_{15B}$, respectively. The $SC_{15A}$ and $SC_{15B}$ receive the $X_SA_iA_o$ input signals and they each output a pair of signals, one signal representing its input signal's MSP in digital form, and the other signal representing its input signal's residual LSP in analog form. The $REF_{15A}$ provides the reference signal for $SC_{15A}$ and $SC_{15B'}$ and as such it establishes the full-scale to zero-scale analog ranges of the analog input signals. Let's call the reference (REF) scale factor of $REF_{15A}$ as S, where value of full scale $REF_{15A}=S \times REF$. The $SC_{15A}$ outputs a digital-output $P_{D15M}$ signal (that is n-bit wide) which is the digital representation of its MSP of the analog-input signal $P_{A15}$. Also, the $SC_{15A}$ outputs an analog-output $P_{A15L}$ signal which is the analog representation of the LSP of the analog-input signal $P_{A15}$. As stated earlier, note that for the purpose of $SM^3$ method as embodied in the illustration of FIG. 15, a signal (e.g., $P_{A15}$) value is equal to the sum of its MSP and its residual LSP where the MSP and residual LSP can be represented in analog, digital, or analog and digital combination formats. Similarly, $SC_{15B}$ outputs a digital-output $Q_{D15M}$ signal (that is m-bit wide) which is the digital representation of its MSP of the analog-input signal $Q_{415}$. Also, the $SC_{15B}$ outputs an analog-output $Q_{A15L}$ signal which is the analog representation of the residual LSP of the analog-input signal $Q_{A15}$. Similarly, note that for the purpose of $SM^3$ method as embodied in the illustration of FIG. 15, a signal (e.g., $Q_{A15}$) value is equal to the sum of its MSP and its residual LSP where the MSP and residual LSP can be represented in analog, digital, or analog and digital combination formats.

At this point, the MSP segments multiplication is described. In FIG. 15, the mixed-mode circuit denoted as $XDA_{15}$ receives the digital words $P_{D15M}$ (that is n-bit wide) signal and $Q_{D15M}$ (that is m-bit wide) signal, and multiplies the two signals and generates an analog multiplication result $P_{A15M} \times Q_{A15M'}$. The reference signal to $XDA_{15}$ is $REF_{15B'}$ and let's call the reference (REF) scale factor of $REF_{15B}$ as S, where value of full scale $REF_{15B} = S \times REF$. Multiplication of $P_{A14M} \times Q_{D14M}$ and generating their result represented in analog form (i.e., $P_{A14M} \times Q_{A14M}$) can be realized by using multiplying DACs. For example, $REF_{15B}$ is the reference signal to a first DAC whose output supplies the reference signal of a second DAC, as described in the MSP segment multiplication (e.g. $DAC_{14A}$ paied with $DAC_{14B}$) in section 14. Alternatively, $P_{D15M}$ and $Q_{D15M}$ can be multiplied in digital logic and their digital multiplication results $P_{D15M} \times Q_{D15M}$ can be fed onto a DAC that generates the respective analog multiplication result $P_{A15M} \times Q_{A15M'}$.

Now, the MSP and LSP segments cross multiplication is described. Also, in FIG. 15, the reference input of a $DAC_{15A}$ receives a signal $P_{A15L}$. Note that the zero-scale to full-scale value of signal $P_{A15L}$ applied to reference input of $DAC_{15A}$ is scaled at $S' \times REF$. The digital-input port of $DAC_{15A}$ receive the digital input word $Q_{D15M'}$ and the $DAC_{15A}$ generates an analog signal $P_{A15L} \times Q_{A15M'}$ at its analog-output port. The digital-input port of $DAC_{15B}$ receive the digital input word $P_{D15M'}$ and the reference input of a $DAC_{15B}$ receives the analog signal $Q_{A15L'}$. Similarly, in FIG. 15, note that the zero-scale to full-scale value of signal $Q_{A15L}$ applied to reference input of $DAC_{15B}$ is scaled at $S' \times REF$. Accordingly, $DAC_{15B}$ generates an analog signal $P_{A15M} \times Q_{A15L'}$ at its analog-output port. The MSP and LSP segments cross multiplication segment's results are summed together in the analog circuit $A_{15A}$ which generates $P_{A15L} \times Q_{M15M'} + P_{A15M} \times Q_{A15L''}$ Here, the LSP segments multiplication is described. In FIG. 15, $XA_{15}$ is an analog-input to analog-output multiplier with a reference signal $REF_{15C}$ that is scaled at $S'' \times REF$. The $XA_{15}$ receive the analog signals $Q_{A15L}$ and $P_{A15L}$ and generates an analog signal $P_{A14L''} \times Q_{A14L''}$ at its analog-output port.

Now, the reference signal scaling ratios for the respective MSP and LSP segment multiplication is described by way of an example. For instance, for n=m=2 bits, then for $S=1 \rightarrow S'=S/2^n=S/2^2=S/4$ and $S''=S'/2^m=S'/2^2=S'/4=S/(4\times 4)$. In this example, if REF=16 units, then zero to full-scale value of $REF_{15A}$ would be 16 units; zero to full-scale value of $REF_{15B}$ would be 16 units; zero to full-scale value of $P_{A15L}$ and $Q_{A15L}$ that are applied as reference signals to $DAC_{15A}$ and $DAC_{15B}$, respectively, would be 16/4=4 units; and zero to full-scale value of $REF_{15C}$ would be 16/4×4=1 unit.

Accordingly, upon proper scaling of the segmented analog signals and their summation before or after the analog circuit $A_{15}$, a final multiplication analog result is generated where $P_{A15} \times Q_{A15} = P_{A15M} \times Q_{A15M} + P_{A14M} \times Q_{A15L} + P_{A15L} \times Q_{A15M'} + P_{A15L''} \times Q_{A15L''}$.

It would be obvious to one skilled in the art to convert the analog multiplication signal $P_{A15} \times Q_{A15}$ to its digital equivalent $P_{D15} \times Q_{D15}$ utilizing an ADC.

Figure 16:
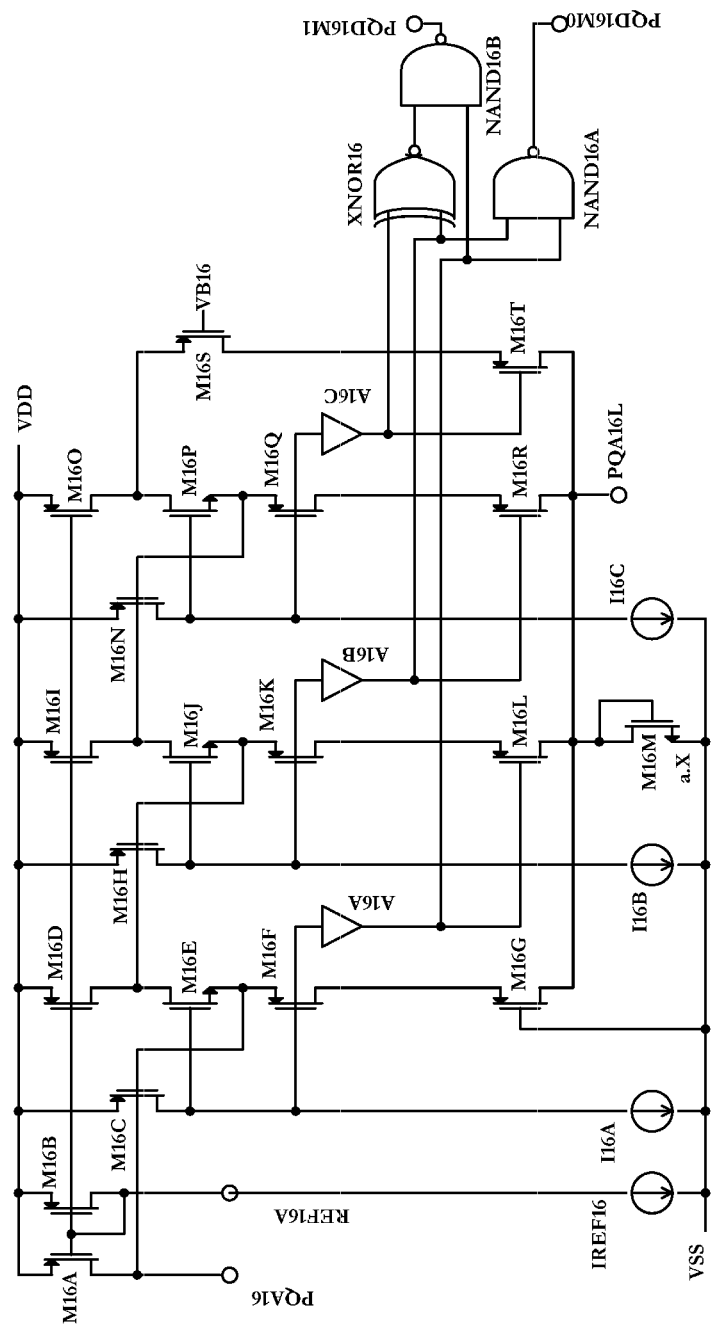
FIG. 16 is a simplified circuit schematic illustrating an embodiment of a signal conditioning (SC) circuit, that can be utilized for $SC_{15A}$ and $SC_{15B}$ blocks illustrated in FIG. 15 of section 15. The circuit in FIG. 16 is part of the current analog-input to current analog-output multiplier ($X_SI_iI_o$) that is arranged by utilizing segmented mixed-mode multiplication ($SM^3$) method.

Section 16—Description of FIG. 16

FIG. 16 is a simplified circuit schematic illustrating a signal conditioning (SC) circuit, that can be utilized as $SC_{15A}$ and $SC_{15B}$ blocks that are illustrated in FIG. 15 of section 15, as part of a current analog-input to current analog-output multiplier ($X_S I_i I_o$) is arranged utilizing segmented mixed-mode multiplication ($SM^3$) method.

The SC circuit of FIG. 16 receives its current analog input $PQA_{16} = i_i$, and generates 2-bits (n=m=2) of digital MSP signals $PQD_{16M0}$ and $PQD_{16M1}$ as well a residual analog LSP signal $PQA_{16L}$. At its $REF_{16A}$ port, the SC circuit receives its reference signal $IREF_{16} = i_r/4$ which is mirrored through $M_{16B}$ onto 4 (e.g., $2^n = 2^m = 2^2 = 4$) current mirror reference segments $M_{16A}$, $M_{16C}$, $M_{16I}$, and $M_{16O}$. The voltage bias signal $VB_{16}$ provides the gate voltage for $M_{16S}$. Note that the accuracy of the SC circuit and that of the multiplier $X_S I_i I_o$ is dominated, firstly, by the matching between the current reference segments and current mirror FETs $M_{16A}$, $M_{16C}$, $M_{16I}$, and $M_{16O}$. Also, note that the zero-scale to full-scale span of SC circuit is 4× $i_r/4 = i_r$.

At the analog input $PQA_{16}$, an analog-input signal $i_t$ is first compared with the first current mirror ($M_{16A}$) reference segment that has a value of $i_r/4$. The resultant difference flows either through $M_{16E}$ or $M_{16F}$ depending on the polarity of ($i_t - i_r/4$) and accordingly a digital signal is outputted by $A_{16A}$. If $i_t < i_r/4$, then the difference or ($i_t - i_r/4$) flows through $M_{16F}$ and onto $M_{16G}$. On the other hand, if $i_t > i_r/4$, then the difference or ($i_t - i_r/4$) flows through $M_{16E}$ where ($i_t - i_r/4$) gets compared with $i_r/4$ which is $M_{16D}$'s current.

Similarly, the difference ($i_t - i_r/4) - i_r/4$ flows either through $M_{16J}$ or $M_{16K}$ depending on the polarity of ($i_1 - i_r/4 - i_r/4$) and accordingly a digital signal is outputted by $A_{16B}$. If $i_t - i_r/4 < i_r/4$, then the difference or ($i_t - i_r/4) - i_r/4$ flows through $M_{16K}$ and onto $M_{16L}$. On the other hand, if $i_t - i_r/4 > i_r/4$, then the difference ($i_t - i_r/4) - i_r/4$ flows through $M_{16J}$ where ($i_t - i_r/4$) gets compared with $i_r/4$ which is $M_{16I}$'s current.

As $i_i$ ripples through (the effectively) the SC circuit's thermometer current reference (four segment) network, the digital signals outputted by $A_{16A}$, $A_{16B}$, and $A_{16C}$ (with proper sign) control the current flow through the analog switches $M_{16L}$, $M_{16R}$, and $M_{16T}$ whose sum of current flows $M_{16M}$. Note that the gate to source voltage of $M_{16M}$ and the current through $M_{16M}$ represent the residual analog LSP of the SC circuit's input current.

Figure 20:
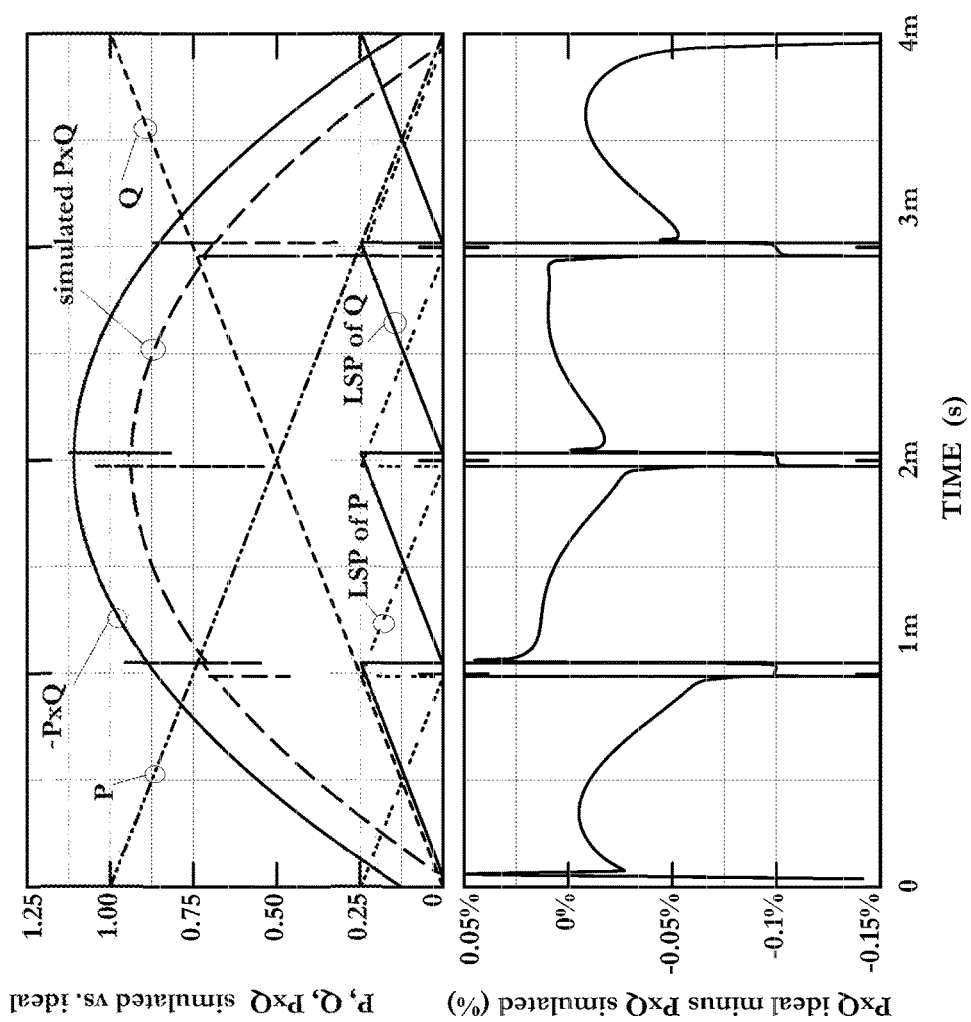
FIG. 20 is a circuit simulation showing waveforms of the current analog-input to current analog-output multiplier ($X_SI_iI_o$), that is arranged utilizing segmented mixed-mode multiplication ($SM^3$) method and illustrated in FIG. 15, which utilizes the circuits illustrated in FIGS. 16, 17, 18, and 19.

FIG. 20 upper graphs illustrate a pair of triangular saw-tooth waveforms which are residual 'LSP of P' and residual 'LSP of Q' signals. This saw-tooth waveform illustrate the equivalent current residual LSP signals $P_{A15L}$ and $Q_{A15L}$ generated by $SC_{15A}$ and $SC_{15B}$ blocks in FIG. 15 (of section 15) that utilize the SC circuit of FIG. 16 (of section 16).

To avoid the transitional glitches that appears at the final multiplication results due in part to the MSP transitions, the SC circuit can be modified to output an equilateral triangular waveform instead of a saw-tooth triangular waveform. As such, the triangular waveform does not pulse from full-scale to zero-scale. Accordingly, the final multiplication results can be generated by proper analog and digital signal re-assembly of the MSP and residual LSP segments.

In FIG. 20, it can be observed that the zero-scale to full-scale span of 'LSP of P' and residual 'LSP of Q' signals ratio versus zero-scale to full scale span of SC circuit are is $1/2^n=1/2^m=1/2^2=1/4$. FIG. 20 will be described in more detail later in section 20.

Also, note that the digital signals outputted by $A_{16A}$, $A_{16B}$, and $A_{16C}$ with proper sign control, are inputted to a 3-bit (e.g., $2^n-1=2^m-1=2^2-1=3$) to 2-bit encoder (comprising $XNOR_{16}$, $NAND_{16A}$, and $NAND_{16B}$) that generate ($PQD_{16M0}$ and $PQD_{16M1}$ which is) the digital MSP of the SC circuit's input current.

Accordingly, utilizing the SC circuit of FIG. 16 as $SC_{15A}$ and or $SC_{15B}$ of FIG. 15, the FIG. 16's SC circuit's analog-output signal $PQA_{16L}$ represents scaled equivalent of FIG. 15 $SC_{15A}$ and or $SC_{15B}$ analog signals $P_{A15L}$ and or $Q_{A15L}$ (the LSP of P and LSP of Q signals), respectively. Similarly, FIG. 16's SC circuit's digital-output word $PQD_{16M0/1}$ represents scaled equivalent of FIG. 15 $SC_{15A}$ and or $SC_{15B}$ digital words $P_{D15M}$ and or $Q_{D15M}$ (the MSP of P and or MSP of Q signals, respectively.

Note that other circuits such as current mode algorithmic analog to digital converters can be utilized to generate the digital MSP and the residual analog LSP of its respective analog input current signal.

Figure 17:
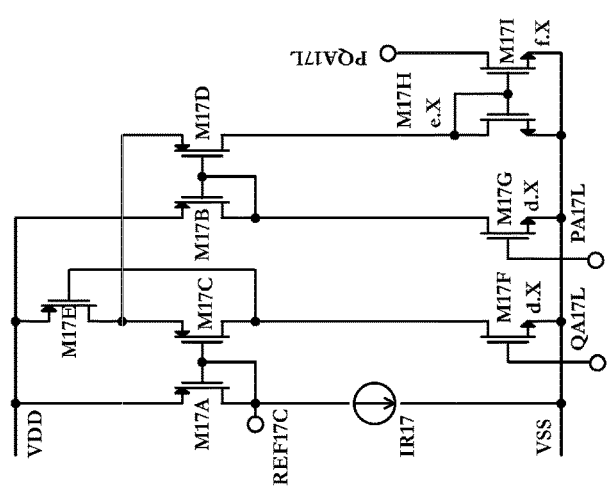
FIG. 17 is a simplified circuit schematic illustrating a current analog-input to current analog output multiplier circuit, operating in subthreshold, that can be utilized as $XA_{15}$ block that is illustrated in FIG. 15 of section 15. The circuit in FIG. 17 is a part of a current analog-input to current analog-output multiplier ($X_SI_iI_o$) that is arranged by utilizing segmented mixed-mode multiplication ($SM^3$) method.

Section 17—Description of FIG. 17

FIG. 17 is a simplified circuit schematic illustrating a current analog-input to current analog-output multiplier circuit, operating in subthreshold, that can be utilized as the $XA_{15}$ block that is illustrated in FIG. 15 of section 15, as a part of a current analog-input to current analog-output multiplier $(X_SI_tI_o)$ is arranged utilizing segmented mixed-mode multiplication ($SM^3$) method.

The current analog multiplier illustrated in FIG. 17 receives two analog input signals, $PA_{17L}$ and $QA_{17L}$, and generates their multiplication $I_{N17A} \times I_{N17B}/I_{R17}$ which is a current analog-output signal $PQA_{17L}$. The current analog multiplier illustrated in FIG. 17 also has a current reference input signal $IR_{17}$ that is inputted at $REF_{17C}$ port. Currents through FETs $M_{17F}$ and $M_{17G}$ scaled at d.X (relative to its mirror FET $M_{16M}$ in FIG. 16) receive the residual analog 'LSP of P' and 'LSP of Q' signal currents, respectively. The current analog multiplier illustrated in FIG. 17 operates in subthreshold, and as such its FETs behave like pseudo-bipolar transistors. Therefore, the voltage loop provides the following: $-VGS_{M17A}+VGS_{M17C}$ $VGS_{M17D}+VGS_{M17B}=0$. Thus, $I_{M17C}/I_{M17A}$ $I_{M17B}/I_{M17D}$ or $I_{M17F}/I_{R17}=I_{M17D}/I_{M17G}$ or $I_{M17D}=I_{M17F} \times I_{M17G}/I_{R17}$, which is mirrored by $M_{17H}$ and $M_{17I}$ and scaled e.X and f.X current mirror scale factors to provide $PQ_{A17L}$ multiplication of the residual analog 'LSP of P' and 'LSP of Q' signal currents with the proper sign.

Accordingly, the $PQ_{A17L}$ analog signal in FIG. 17 is a scaled equivalent analog signal to that of $P_{A15L''} \times Q_{A15L''}$ in FIG. 15 of section 15.

As discussed earlier, the errors attributed to multiplier's linearity or settling time are attenuated (referred back to the input signals of $X_SI_tI_o$ of FIG. 15) since the current analog multiplier of FIG. 17 only handles the residual LSP of P and Q signals. As such, the analog multiplier of FIG. 17 can be made simple, and small (low cost).

Note that current analog-input to analog-output multipliers (relying on the square function relationship between voltage and current in CMOS) that operate in higher current levels in the MOSFET saturation region (not limited to subthreshold operation) can also be utilized depending on the application requirement.

Figure 18:
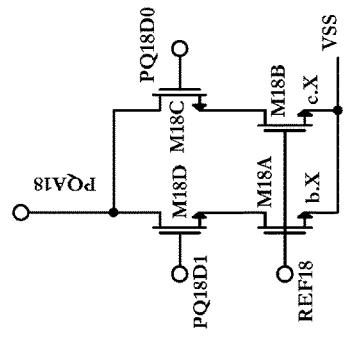
FIG. 18 is a simplified circuit schematic illustrating a digital-input to current analog-output multiplying DAC, that can be utilized as $DAC_{15A}$ and $DAC_{15B}$ block that is illustrated in FIG. 15 of section 15. The circuit in FIG. 18 a part of a current analog-input to current analog-output multiplier ($X_SI_iI_o$) that is arranged by utilizing segmented mixed-mode multiplication ($SM^3$) method.

Section 18—Description of FIG. 18

FIG. 18 is a simplified circuit schematic illustrating a digital-input to current analog-output multiplying DAC, that can be utilized as $DAC_{15A}$ and $DAC_{15B}$ blocks illustrated in FIG. 15 of section 15. The circuit in FIG. 18 a part of a current analog-input to current analog-output multiplier $(X_SI_tI_o)$ is arranged utilizing segmented mixed-mode multiplication ($SM^3$) method.

In FIG. 18, the digital input word comprising two-bit wide digital word signal ($PQ_{18D1}$ and $PQ_{18D0}$) that can correspond to either of $P_{D15M}$ (n=2 bit wide) or $P_{Q15M}$ (m=2 bit wide) of FIG. 15 in section 15. The FIG. 18's DAC's reference signal is $REF_{18}$ corresponds to the $PQ_{A16L}$ of FIG. 16 in section 16, which can correspond to either $P_{A15L}$ or $Q_{A15L}$ of FIG. 15 in section 15. Note that FET $M_{16M}$ with a.X scale (in FIG. 16) is mirrored onto FETs $M_{18A}$ (scaled at b.X) and $M_{18B}$ (scaled at c.X) in FIG. 18, where c=2b which binary scales the FIG. 18 DAC's $M_{18A}$ and $M_{18B}$ currents, relative to the FIG. 16's $M_{16M}$'s current signal (which can be the 'LSP of P' or 'LSP of Q' signals).

As discussed earlier, the errors attributed to FIG. 18's multiplying DAC's linearity are attenuated (referred back to the input signals of $X_SI_tI_o$ of FIG. 15) since the current analog multiplier of FIG. 18 handles the intermediate or cross multiplication of MSP of P and Q signals with the residual LSP of P and Q signals. The multiplying DAC of FIG. 17 is fast since it runs current mode (with current sources being steered with digital switches) and can be made simple, and small (low cost).

Figure 19:
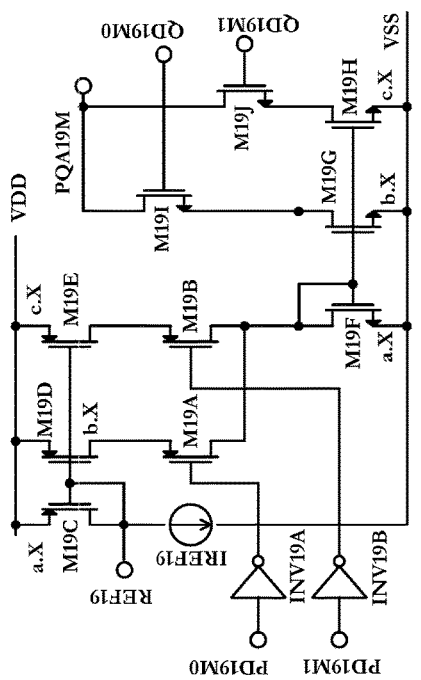
FIG. 19 is a simplified circuit schematic illustrating a digital-input to current analog-output multiplier, utilizing two current mode DACs, that can be utilized as $XDA_{15}$ block that is illustrated in FIG. 15 of section 15. The circuit in FIG. 19 a part of a current analog-input to current analog-output multiplier ($X_SI_iI_o$) that is arranged by utilizing segmented mixed-mode multiplication ($SM^3$) method.

Section 19—Description of FIG. 19

FIG. 19 is a simplified circuit schematic illustrating a digital-input to current analog-output multiplier, utilizing two current mode DACs, that can be utilized as $XDA_{15}$ block that is illustrated in FIG. 15 of section 15. The circuit in FIG. 19 a part of a current analog-input to current analog-output multiplier $(X_SI_tI_o)$ is arranged utilizing segmented mixed-mode multiplication ($SM^3$) method.

The multiplying DAC of FIG. 19 (that corresponds to $XDA_{15}$ of FIG. 15) multiplies the MSP portion of P to MSP portion of Q signals as it pertains to FIG. 15. The multiplying DAC of FIG. 19 receives a n=2 bit digital word signal ($P_{D19M0}$, $P_{D19M1}$) that it multiplies with another m=2 bit digital word signal ($Q_{D19M0}$, $Q_{D19M1}$) and outputs their multiplication as an analog current $PQ_{A19M}$ signal. The reference signal $IREF_{19}$ applied to $REF_{19}$ port of a first iDAC in FIG. 19 that is mirrored and scaled by FETs $M_{19C}$ (scaled at a.X), $M_{19D}$ (scaled at b.X), and $M_{19E}$ (scaled at c.X) where c=2b for the first iDAC's binary-scaled current reference network. The output of the first iDAC is fed onto a second iDAC through FETs $M_{19F}$ (scaled at a.X) which is married with $M_{19G}$ (scaled at b.X) and $M_{19H}$ (scaled at c.X) where c=2b for the second iDAC's binary-scaled current reference network.

Note that the digital word signal ($P_{D19M0}$, $P_{D19M1}$) of FIG. 19 corresponds to the n=2 bit word $P_{D15M}$ of FIG. 15; the digital word signal ($Q_{D19M0}$, $Q_{D19M1}$) of FIG. 19 corresponds to the m=2 bit word $Q_{D15M}$ of FIG. 15; and the analog output signal $PQ_{A19M}$ of FIG. 19 corresponds to $P_{A15M} \times Q_{A15M}$ signal of FIG. 15.

The multiplying iDAC of FIG. 19 is current mode and fast, which enhances the overall dynamic performance of the $X_S I_i I_o$. The matching of the FETs in the IDAC's current mirrors ($M_{19C}$, $M_{19D}$, and $M_{19E}$ as well as matching between $M_{19F}$, $M_{19G}$, and $M_{19H}$) dominates the accuracy of the overall $X_S I_i I_o$. Also as stated earlier, the function of digital input to analog output multiplication of $XDA_{15}$ can be performed by multiplying the digital bits utilizing a digital multiplier (e.g. 2-bits by 2-bit digital input to 4-bit digital output digital multiplier) and then feeding the output of the digital multiplier to a (e.g., 4-bit) iDAC.

Section 20—Description of FIG. 20

FIG. 20 is a circuit simulation showing waveforms of the current analog-input to current analog-output multiplier ($X_S I_i I_o$), that is arranged utilizing segmented mixed-mode multiplication ($SM^3$) method, and illustrated in FIG. 15. FIG. 20's illustrated simulation waveforms pertain to a $X_S I_i I_o$ that utilizes the circuits illustrated in FIG. 16 (corresponding to $SC_{15A}$ and $SC_{15B}$ of FIG. 15), FIG. 17 (corresponding to $XA_{15}$ of FIG. 15), FIG. 18 (corresponding to the $DAC_{15A}$ and $DAC_{15B}$ of FIG. 15), and 19.

Note that the final output of the FIG. 15's multiplier $X_S I_i I_o$ or $P_{A15} \times Q_{A15}$ is the sum of the corresponding current signals $PQ_{A19M}$ (one of FIG. 19's circuit pertain to the Q and P MSP multiplication output result) plus current signals $PQ_{A18}$ (two of FIG. 18's circuit pertaining to the cross multiplication of P and Q MSP and LSP output result) plus $PQ_{A17L}$ (one of FIG. 17's circuit pertain to the Q and P LSP multiplication output result), where each if the segment currents have been proportionally scaled as described earlier.

The upper graph in FIG. 10 illustrated the P spanning from full scale to zero scale while Q spans from zero-scale to full scale and the ideal P×Q waveforms all of which are normalized over their absolute value (for illustrative clarity of signals spanning between one and zero, and where P×Q is offset by 0.125 to avoid pictorial over-lap). Note that P, Q, and P×Q correspond to $P_{A15}$, $Q_{A15}$, and $P_{A15} \times Q_{A15}$ signals of FIG. 15, respectively.

The upper graph in FIG. 20 also shows the simulated P×Q, as well as the residual LSP of P and residual LSP of Q signals which are the saw tooth signals and $1/2^n = 1/2^m = 1/2^2 = 1/4$ of the full scale of P and Q signals. Again, in FIG. 20, the signals shown as residual LSP of P and residual LSP of Q correspond to $P_{A15L}$, and $Q_{A15L}$ signals in FIG. 15, respectively, which are applied to as reference signals for $DAC_{15A}$ and $DAC_{15B}$.

The lower graph in FIG. 20 shows the simulated P×Q minus the ideal P×Q to generate a linearity error plot for the multiplier $X_S I_i I_o$. As expected, note that the overall $X_S I_i I_o$'s linearity error is about 0.14% which is attenuated by about $1/(2^2 \times 2^2) = 1/16$ of the roughly 2% linearity error associated with the current analog-input to current analog output circuit illustrated in FIG. 17 analog multiplier.

What is claimed is:

1. A method of modifying the transfer function of a data converter, the method comprising:
   providing a first data converter having a first reference network defining a first input-to-output transfer function, wherein the first reference network may be shared among a plurality of data converters;
   programming the first reference network to modify the first input-to-output transfer function; and
   programming the first reference network such that the first input-to-output transfer function approximates a square function.

2. The method of modifying the transfer function of a data converter of claim 1, the method further comprising:
   applying a first input signal P to a first input port of the first data converter; and
   generating, at a first output port of the first data converter, a first product approximating the square of P.

3. A method of modifying the transfer function of a data converter, the method comprising:
   providing a first data converter having a first reference network defining a first input-to-output transfer function, wherein the first reference network may be shared among a plurality of data converters;
   programming the first reference network to modify the first input-to-output transfer function; and
   programming the first reference network such that the first input-to-output transfer function approximates a logarithmic function.

4. The method of modifying the transfer function of a data converter of claim 3, the method further comprising:
   applying a first input signal P to a first input port of the first data converter; and
   generating, at a first output port of the first data converter, a first product approximating the logarithm of P.

5. A method of multiplying signals utilizing data converters, the method comprising:
   applying a first input signal (P) to a first input port of a first analog-to-digital converter (ADC);
   applying a plurality (z) of input signals ($Q_Z$) to a plurality of reference ports ($R_Z$) of a plurality of digital-to-analog converters ($DAC_Z$);
   coupling a first output port of the first ADC to a plurality of digital input ports of the plurality of $DAC_Z$s; and
   generating a plurality of products at a plurality of analog output ports of the plurality of $DAC_Z$s, wherein a plurality of products are multiplications of the P signal by the plurality of the $Q_Z$ signals.

6. The method of multiplying signals of claim 5, the method further comprising:
   operating the first ADC in current mode.

7. The method of multiplying signals of claim 5, the method further comprising:
   operating the plurality of $DAC_Z$s in current mode.

8. A method of multiplying signals utilizing data converters, the method comprising:
   adding a first signal P to a second signal Q to generate a first intermediate sum P+Q and generating absolute value of the P+Q;
   subtracting the second signal Q from the first signal P to generate a first intermediate difference P−Q and generating absolute value of the P+Q;
   programming a first data converter and a second data converter such that the respective input-to-output transfer functions of the first and the second data converters each approximates a square function;
   coupling absolute value of the P+Q to a first input port of the first data converter to generate a first approximate product $(P+Q)^2$;
   coupling the absolute value of the P−Q to a first input port of the second data converter to generate a first approximate product $(P-Q)^2$;
   subtracting $(P-Q)^2$ from $(P+Q)^2$ to generate a difference signal 4× P×Q; and
   and
   scaling the difference signal 4× P×Q to generate a resultant P×Q.

9. The method of multiplying signals of claim 8, the method further comprising:

utilizing data converters comprising resistive elements; and sharing the resistive elements among a plurality of data converters.

10. The method of multiplying signals of claim 8, the method further comprising:

utilizing current mode data converters.

11. The method of multiplying signals of claim 8, the method further comprising:

utilizing algorithmic data converters.

12. A method of multiplying signals utilizing data converters, the method comprising:

programming a first data converter and a second data converter such that the respective input-to-output transfer functions of the first and the second data converters each approximates a logarithmic function;

coupling a first signal P to the first data converter to generate a first approximate product log P;

coupling a second signal Q to the second data converter to generate a second approximate product log P; and adding log P to log Q to generate a first product log(P×Q).

13. The method of multiplying signals of claim 12, the method further comprising:

programming a third data converter such that its input-to-output transfer functions approximates an anti-logarithmic function; and coupling the first product log(P×Q) to the input of the third data converter to generate a second product P×Q.

14. The method of multiplying signals of claim 12, the method further comprising:

utilizing data converters comprising input-to-output transfer functions that utilize resistive elements;

programming the resistive elements to program the input-to-output transfer functions of the data converters to approximate at least one of logarithmic and anti-logarithmic transfer functions; and sharing the resistive elements among a plurality of data converters.

15. The method of multiplying signals of claim 12, the method further comprising:

utilizing current mode data converters.

16. The method of multiplying signals of claim 12, the method further comprising:

utilizing algorithmic data converters.

17. A method of multiplying signals utilizing data converters, the method comprising:

segmenting a first signal P into a first most significant portion MP and a first least significant portion LP;

segmenting a second signal Q into a second most significant portion MQ and a second least significant portion LQ;

multiplying MP by MQ to produce a first product MP×MQ;

multiplying MP by LQ to produce a second product MP×LQ;

multiplying MQ by LP to produce a third product MQ×LP;

wherein at least one of the multiplying MP by MQ, multiplying MP by LQ, and multiplying MQ by LP, is performed in a mixed mode multiplication; and combining the first, second, and third products to generate a first final product P×Q of the first signal P and the second signal Q.

18. The method of multiplying signals of claim 17, the method further comprising:

performing the mixed mode multiplication utilizing at least one multiplying digital to analog converter.

19. The method of multiplying signals of claim 18, the method further comprising:

wherein the multiplying digital to analog converter operates in current mode.

20. The method of multiplying signals of claim 17, the method further comprising:

performing the mixed mode multiplication utilizing at least one multiplying analog to digital converter.

21. The method of multiplying signals of claim 17, the method further comprising:

the segmenting of the first signal P is performed in a first analog to digital converter, wherein the first most significant portion MP is digital and the first least significant portion LP is analog; and the segmenting of the second signal Q is performed in a second analog to digital converter, wherein the second most significant portion MQ is digital and the second least significant portion LQ is analog.

22. The method of multiplying signals of claim 21, the method further comprising:

wherein the first analog to digital converter operates as an algorithmic analog to digital converter.

23. The method of multiplying signals of claim 22, the method further comprising:

wherein the second analog to digital converter operates as an algorithmic analog to digital converter.

24. The method of multiplying signals of claim 17, the method further comprising:

the multiplying MP by LQ to produce the second product MP×LQ is performed in a first multiplying digital to analog converter; and the multiplying MQ by LP to produce the third product MQ by LP is performed in a second multiplying digital to analog converter.

25. The method of multiplying signals of claim 17, the method further comprising:

the multiplying MP by MQ to produce the first product MP×MQ is performed in a first digital multiplier.

26. The method of multiplying signals of claim 17, the method further comprising:

multiplying LP by LQ to produce a fourth product LP×LQ; and combining the fourth product with the first final product.

\* \* \* \* \*